United States Patent
Kandanarachchi

(10) Patent No.: US 10,429,734 B2
(45) Date of Patent: Oct. 1, 2019

(54) PERMANENT DIELECTRIC COMPOSITIONS CONTAINING PHOTOACID GENERATOR AND BASE

(71) Applicant: PROMERUS, LLC, Brecksville, OH (US)

(72) Inventor: Pramod Kandanarachchi, Brecksville, OH (US)

(73) Assignee: PROMERUS, LLC, Brecksville, OH (US)

( * ) Notice: Subject to any disclaimer, the term of this patent is extended or adjusted under 35 U.S.C. 154(b) by 0 days.

(21) Appl. No.: 15/364,316

(22) Filed: Nov. 30, 2016

(65) Prior Publication Data

US 2017/0153546 A1 Jun. 1, 2017

Related U.S. Application Data

(60) Provisional application No. 62/260,881, filed on Nov. 30, 2015.

(51) Int. Cl.
| | | |
|---|---|---|
| *G03F 7/004* | (2006.01) | |
| *G03F 7/40* | (2006.01) | |
| *G03F 7/038* | (2006.01) | |
| *G03F 7/039* | (2006.01) | |
| *C08F 8/12* | (2006.01) | |
| *C08F 8/14* | (2006.01) | |
| *G03F 7/32* | (2006.01) | |
| *G03F 7/38* | (2006.01) | |
| *H01L 21/02* | (2006.01) | |
| *H01L 21/311* | (2006.01) | |

(52) U.S. Cl.
CPC .............. *G03F 7/0382* (2013.01); *C08F 8/12* (2013.01); *C08F 8/14* (2013.01); *G03F 7/0045* (2013.01); *G03F 7/0046* (2013.01); *G03F 7/038* (2013.01); *G03F 7/0395* (2013.01); *G03F 7/322* (2013.01); *G03F 7/38* (2013.01); *G03F 7/40* (2013.01); *C08F 2800/10* (2013.01); *C08F 2810/50* (2013.01); *H01L 21/02118* (2013.01); *H01L 21/02282* (2013.01); *H01L 21/311* (2013.01)

(58) Field of Classification Search
CPC .......... G03F 7/0397; G03F 7/40; G03F 7/0382
USPC .......... 430/270.1, 326, 905, 910, 280.1, 325
See application file for complete search history.

(56) References Cited

U.S. PATENT DOCUMENTS

| | | | | |
|---|---|---|---|---|
| 6,103,445 | A * | 8/2000 | Willson | ................. G03F 7/039 430/270.1 |
| 9,063,411 | B2 * | 6/2015 | Han | ....................... G03F 7/004 |
| 2002/0018960 | A1 | 2/2002 | Lee et al. | |
| 2012/0129101 | A1 | 5/2012 | Onishi et al. | |
| 2014/0087293 | A1 * | 3/2014 | Kandanarachchi | ... C08F 232/08 430/13 |

FOREIGN PATENT DOCUMENTS

| | | | |
|---|---|---|---|
| EP | 0 789 278 | A2 | 8/1997 |
| EP | 1 254 915 | A2 | 1/2002 |

OTHER PUBLICATIONS

Hyun-Pyo Jeon, et al., "New ArF Photoresist Based on Modified Maleic Anhydride Cycloolefin Polymers," J. Photopolym. Sci. Technol., vol. 15, No. 4, 541-548 (2002).

* cited by examiner

*Primary Examiner* — John S Chu
(74) *Attorney, Agent, or Firm* — Balaram Gupta

(57) ABSTRACT

Embodiments encompassing a series of compositions containing photoacid generator (PAG) and a base are disclosed and claimed. The compositions are useful as permanent dielectric materials. More specifically, embodiments encompassing compositions containing a series of copolymers of a variety of norbornene-type cycloolefinic monomers and maleic anhydride in which maleic anhydride is fully or partially hydrolyzed (i.e., ring opened and fully or partially esterified), PAG and a base, which are useful in forming permanent dielectric materials having utility in a variety of electronic material applications, among various other uses, are disclosed.

17 Claims, 4 Drawing Sheets

PERMANENT DIELECTRIC COMPOSITIONS CONTAINING PHOTOACID GENERATOR AND BASE

CROSS REFERENCE TO RELATED APPLICATIONS

This application claims the benefit of U.S. Provisional Application No. 62/260,881, filed Nov. 30, 2015, which is incorporated herein by reference in its entirety.

TECHNICAL FIELD

The present invention relates to a series of compositions containing a photoacid generator (PAG) and a base, which are useful as permanent dielectric materials. More specifically, the present invention relates to compositions containing a series of copolymers of a variety of norbornene-type cycloolefinic monomers and maleic anhydride in which maleic anhydride is fully or partially hydrolyzed (i.e., ring opened and fully or partially esterified), PAG and a base, which are useful in forming permanent dielectric materials having utility in a variety of electronic material applications, among various other uses.

BACKGROUND

As the microelectronic devices are fabricated in smaller geometries there is an increasing demand for advanced materials that meet the stringent requirements of confined smaller geometries. In particular, sub-micron device geometries have become common place in the fabrication of a variety of microelectronics packages for memory and logic integrated circuits (ICs), liquid crystal displays (LCDs), organic light emitting diodes (OLEDs) and other radio frequency (Rf) and microwave devices. For example, devices such as radio frequency integrated circuits (RFICs), micro-machine integrated circuits (MMICs), switches, couplers, phase shifters, surface acoustic wave (SAW) filters and SAW duplexers, have recently been fabricated with submicron dimensions.

With such smaller geometries comes a requirement for dielectric materials with low dielectric constants to reduce or eliminate any cross-talk between adjacent signal lines or between a signal line and a device feature (e.g. a pixel electrode) due to capacitive coupling. Although many low dielectric (low-K) materials are available for microelectronic devices, for optoelectronic devices such materials must also be broadly transparent in the visible light spectrum, not require high temperature processing (greater than 300° C.) that would be incompatible with other elements of such an optoelectronic device, and be both low-cost and feasible for large scale optoelectronic device fabrication.

In addition, many of such applications require that such materials feature good thermo-mechanical properties, including low wafer stress and high elongation to break (ETB). Furthermore, the conventional positive tone compositions generally contain multi-functional diazonaphthoquinone (DNQ) photoactive compounds (PACs), which results in lower ETBs and also increase wafer stress.

Thus, it would be desirable to have a material capable of forming a self-imageable layer, which exhibits improved thermo-mechanical properties. Such material should also be easy to apply to a substrate, have a low dielectric constant (3.9 or less) and thermal stability to temperatures in excess of 250° C. Of course, it is also desirable to have such materials available at a lower cost and feature such properties as positive photoimaging capability, aqueous base developing capability, high transparency after heat stress and low weight loss at curing temperatures. It has been reported that acrylic polymers, which are inexpensive, offer good photoimaging properties and are aqueous base developable, see for example, Japanese Patent Application Laid-open No. Hei 5-165214 and the radiation-sensitive resin composition comprising an alicyclic olefin resin disclosed in Japanese Patent Application Laid-open No. 2003-162054. Similarly, polyimides have been reported to provide good thermal stability. However, these materials have certain deficiencies and thus making them not so suitable for the applications contemplated herein. For instance, acrylics are not suitable for applications requiring high thermal stability (i.e., temperatures higher than 200° C.), and many of the polyimides in general are not suitable for either positive tone or negative tone formulations requiring aqueous base developability and generally do not exhibit desirable transparency, thus making them unsuitable in certain optoelectronic applications. Although some polyimides and polybenzoxazoles have low dielectric constants but still may not have low enough permittivity to be effective in highly integrated and/or miniaturized devices having increased wiring density and high signal speed. Furthermore, both polyimides and polybenzoxazoles require cure temperatures in excess of 300° C., thus rendering them unsuitable for many applications. One such known polyimide material is the positive tone photosensitive resin comprising a polyimide precursor and a diazoquinone-type compound disclosed in Japanese Patent No. 3,262,108.

Recently, it has been reported that certain copolymers containing norbornene-type repeat units having pendent maleimide groups and maleic anhydride-type repeat units are useful in certain microelectronic applications featuring self-image forming layer capability, when image-wise-exposed to actinic radiation, see co-pending U.S. patent application Ser. No. 14/034,682, filed Sep. 24, 2013.

However, there is still a need for cost effective permanent dielectric materials having not only self photopatternable properties but also containing no DNQ-type PACs, yet exhibiting good properties, including improved thermo-mechanical properties, retaining film thickness from the unexposed regions of a positive tone formulation (i.e., low dark field loss), low thermal reflow after cure, improved stability to various chemicals and process conditions involved in the downstream process fabrication steps, such as, for example, in a device containing a redistribution layer (RDL), and/or solvent stripper operations, among others.

Thus it is an object of this invention to provide organic polymer materials having aforementioned properties for a variety of electronic and/or optoelectronic device fabrication applications.

BRIEF DESCRIPTION OF THE DRAWINGS

Embodiments in accordance with the present invention are described below with reference to the following accompanying figures and/or images. Where drawings are provided, it will be drawings which are simplified portions of a device provided for illustrative purposes only.

DETAILED DESCRIPTION

Figure 1:
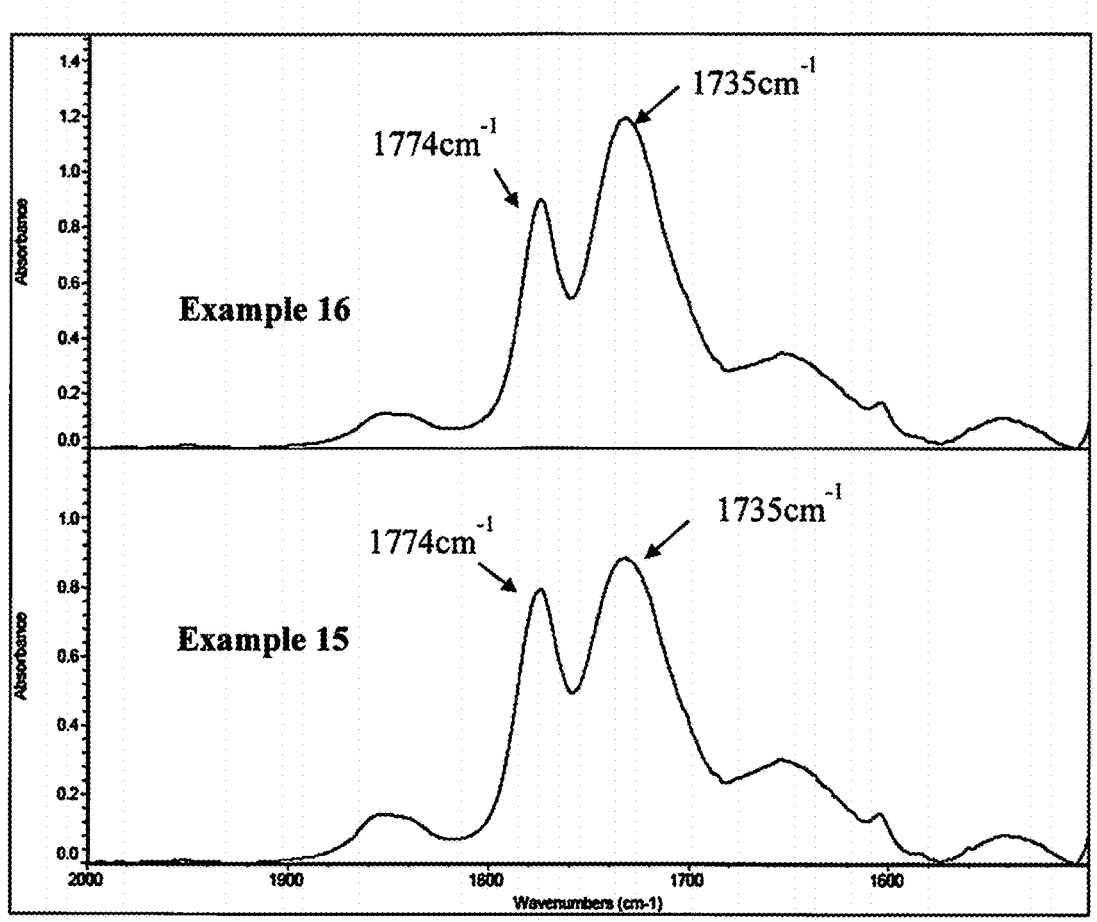
FIG. 1 shows FT-IR spectra of two different composition embodiments of this invention as further discussed herein.

Embodiments in accordance with the present invention are directed to various polymers, including but not limited to, polymers that encompass at least one repeating unit derived from a certain type of norbornene-type monomer as described herein, at least one second repeating unit derived from a maleic anhydride-type monomer, as such are defined hereinafter and at least one third repeating unit derived from a maleimide, and to compositions encompassing such polymers. Such polymer compositions being capable of forming self-imageable films useful as layers in the manufacture of microelectronic and optoelectronic devices. That is to say that, after image-wise exposure to actinic radiation, such layers (or films) can be developed to form patterned layers (or films), where such pattern is reflective of the image through which the layers (or films) was exposed. In this manner, structures can be provided that are, or are to become, a part of such microelectronic and/or optoelectronic devices.

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, the symbol " ~~~ " denotes a position at which the bonding takes place with another repeat unit or another atom or molecule or group or moiety as appropriate with the structure of the group as shown.

As used herein, "hydrocarbyl" refers to a radical of a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, the expression "($C_1$-$C_{15}$)alkyl" includes methyl and ethyl groups, and straight-chained or branched propyl, butyl, pentyl, hexyl, heptyl, and various other homolog groups. Particular alkyl groups are methyl, ethyl, n-propyl, isopropyl and tert-butyl, etc. Derived expressions, such as "($C_1$-$C_{16}$)alkoxy", "($C_1$-$C_{15}$)thioalkyl" "($C_1$-$C_{15}$)alkoxy($C_1$-$C_{15}$)alkyl", "hydroxy($C_1$-$C_{15}$)alkyl", "($C_1$-$C_{15}$)alkylcarbonyl", "($C_1$-$C_{15}$)alkoxycarbonyl($C_1$-$C_{15}$)alkyl", "($C_1$-$C_{15}$)alkoxycarbonyl", "amino($C_1$-$C_{15}$)alkyl", "($C_1$-$C_{15}$)alkylamino", "($C_1$-$C_{15}$)alkylcarbamoyl($C_1$-$C_{15}$)alkyl", "($C_1$-$C_{15}$)dialkylcarbamoyl($C_1$-$C_{15}$)alkyl" "mono- or di-($C_1$-$C_{15}$)alkylamino($C_1$-$C_{15}$)alkyl", "amino($C_1$-$C_{15}$)alkylcarbonyl" "diphenyl($C_1$-$C_{15}$)alkyl", "phenyl($C_1$-$C_{15}$)alkyl", "phenylcarbonyl($C_1$-$C_{15}$)alkyl" and "phenoxy($C_1$-$C_{15}$)alkyl" are to be construed accordingly.

As used herein, the expression "cycloalkyl" includes all of the known cyclic radicals. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "($C_2$-$C_6$)alkenyl" includes ethenyl and straight-chained or branched propenyl, butenyl, pentenyl and hexenyl groups. Similarly, the expression "($C_2$-$C_6$)alkynyl" includes ethynyl and propynyl, and straight-chained or branched butynyl, pentynyl and hexynyl groups.

As used herein the expression "($C_1$-$C_4$)acyl" shall have the same meaning as "($C_1$-$C_4$)alkanoyl", which can also be represented structurally as "R—CO—," where R is a ($C_1$-$C_3$)alkyl as defined herein. Additionally, "($C_1$-$C_3$)alkylcarbonyl" shall mean same as ($C_1$-$C_4$)acyl. Specifically, "($C_1$-$C_4$)acyl" shall mean formyl, acetyl or ethanoyl, propanoyl, n-butanoyl, etc. Derived expressions such as "($C_1$-$C_4$)acyloxy" and "($C_1$-$C_4$)acyloxyalkyl" are to be construed accordingly.

As used herein, the expression "($C_1$-$C_{15}$)perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "($C_1$-$C_{15}$)perfluoroalkoxy", is to be construed accordingly.

As used herein, the expression "($C_6$-$C_{10}$)aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art. Derived expression, "($C_6$-$C_{10}$)arylsulfonyl," is to be construed accordingly.

As used herein, the expression "($C_6$-$C_{10}$)aryl($C_1$-$C_4$)alkyl" means that the ($C_6$-$C_{10}$)aryl as defined herein is further attached to ($C_1$-$C_4$)alkyl as defined herein. Representative examples include benzyl, phenylethyl, 2-phenylpropyl, 1-naphthylmethyl, 2-naphthylmethyl and the like.

As used herein, the expression "heteroaryl" includes all of the known heteroatom containing aromatic radicals. Representative 5-membered heteroaryl radicals include furanyl, thienyl or thiophenyl, pyrrolyl, isopyrrolyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include piperidinyl, piperazinyl, morpholinyl, thiomorpholinyl, and the like. Various other heterocycle radicals include, without limitation, aziridinyl, azepanyl, diazepanyl, diazabicyclo[2.2.1]hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of ($C_1$-$C_6$)alkyl, ($C_2$-$C_6$)alkenyl, ($C_1$-$C_6$)perfluoroalkyl, phenyl, hydroxy, —$CO_2H$, an ester, an amide, ($C_1$-$C_6$) alkoxy, ($C_1$-$C_6$)thioalkyl, ($C_1$-$C_6$)perfluoroalkoxy, —$NH_2$, Cl, Br, I, F, —$NH(C_1$-$C_6)$alkyl, and —$N((C_1$-$C_6)$alkyl$)_2$. However, any of the other suitable substituents known to one skilled in the art can also be used in these embodiments.

The statements below, wherein, for example, $R_5$ and $R_6$ are said to be independently selected from a group of substituents, means that $R_5$ and $R_6$ are independently selected, but also that where an $R_5$ variable occurs more than once in a molecule, those occurrences are independently selected (e.g., if $R_1$ and $R_2$ are each contains a group of formula (A), $R_5$ can be hydrogen in $R_1$, and $R_5$ can be methyl in $R_2$). Those skilled in the art will recognize that the size and nature of the substituent(s) can affect the number and nature of other substituents that can be present.

It should be noted that any atom with unsatisfied valences in the text, schemes, examples and tables herein is assumed to have the appropriate number of hydrogen atom(s) to satisfy such valences.

As used herein, the terms "polymer composition," or "terpolymer composition" are used herein interchangeably and are meant to include at least one synthesized polymer or terpolymer, as well as residues from initiators, solvents or other elements attendant to the synthesis of such polymers, where such residues are understood as not being covalently incorporated thereto. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent(s), antioxidant(s), photoinitiator(s), sensitizers and other materials as will be discussed more fully below.

By the term "derived" is meant that the polymeric repeating units are polymerized (formed) from, e.g., polycyclic norbornene-type monomers, in accordance with formula (I) and maleic anhydride monomers of formula (II), wherein the resulting polymers are formed by 2,3 enchainment of norbornene-type monomers with maleic anhydride monomers in an alternating fashion as shown below:

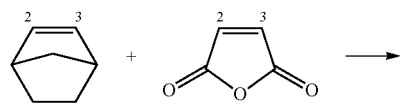

-continued

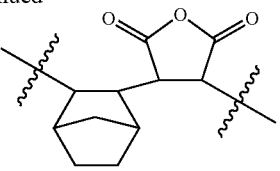

It should be understood that depending upon the monomeric compositions in a given polymer the repeat units may not always be alternating. That is to say, for example, in a polymer containing other than 50:50 molar ratios of norbornene-type monomers with combined molar amounts of maleic anhydride and maleimide monomers, the repeat units are not always alternating but with random blocks of monomers with the higher molar content.

The term "low K" refers in general to a dielectric constant less than that of thermally formed silicon dioxide (3.9) and when used in reference to a "low-K material" it will be understood to mean a material having a dielectric constant of less than 3.9.

The term "photodefinable" refers to the characteristic of a material or composition of materials, such as a polymer composition in accordance with embodiments of the present invention, to be formed into, in and of itself, a patterned layer or a structure. In alternate language, a "photodefinable layer" does not require the use of another material layer formed thereover, for example a photoresist layer, to form the aforementioned patterned layer or structure. It will be further understood that a polymer composition having such a characteristic be employed in a pattern forming scheme to form a patterned film/layer or structure. It will be noted that such a scheme incorporates an "imagewise exposure" of the photodefinable material or layer. Such imagewise exposure being taken to mean an exposure to actinic radiation of selected portions of the layer, where non-selected portions are protected from such exposure to actinic radiation.

The phrase "a material that photonically forms a catalyst" refers to a material that, when exposed to "actinic radiation" will break down, decompose, or in some other way alter its molecular composition to form a compound capable of initiating a crosslinking reaction in the polymer, where the term "actinic radiation" is meant to include any type of radiation capable of causing the aforementioned change in molecular composition. For example, any wavelength of ultraviolet or visible radiation regardless of the source of such radiation or radiation from an appropriate X-ray and electron beam source. Non-limiting examples of suitable materials that "photonically form catalyst" include photoacid generators and photobase generators such as are discussed in detail below. It should also be noted that generally "a material that photonically forms a catalyst" will also form a catalyst if heated to an appropriate temperature. Such exposures are sometimes desirable after developing a positive tone image and to fix the images post developing by blanket exposure to a suitable radiation.

The term "cure" (or "curing") as used in connection with a composition, e.g., "a cured composition," shall mean that at least a portion of the crosslinkable components which are encompassed by the composition are at least partially crosslinked. In some embodiments of the present invention, the crosslinking is sufficient to render the polymer film insoluble in the developer and in some other embodiments the polymer film is insoluble in commonly used solvents. One skilled in the art will understand that the presence and degree of crosslinking (crosslink density) can be determined by a variety of methods, such as dynamic mechanical thermal analysis (DMTA). This method determines the glass transition temperature and crosslink density of free films of coatings or polymers. These physical properties of a cured material are related to the structure of the crosslinked network. Higher crosslink density values indicate a higher degree of crosslinking in the coating or film.

Monomers

Various first type of monomers as described herein which are part of polymer embodiments in accordance with the present invention are generally known in the art. In general, the polymers of this invention encompass a wide range of first type of "polycyclic" repeating units. As defined herein, the terms "polycyclic olefin" or "polycycloolefin" mean the same and are used interchangeably to represent several of the first type of monomeric compounds used to prepare the polymers of this invention. As a representative example of such a compound or a monomer is "norbornene-type" monomer and is generally referred to herein as addition polymerizable monomer (or the resulting repeating unit), that encompass at least one norbornene moiety such as shown below:

The simplest norbornene-type or polycyclic olefin monomer encompassed by embodiments in accordance with the present invention is norbornene itself, also known as bicyclo[2.2.1]hept-2-ene. However, the term norbornene-type monomer or repeating unit is used herein to mean norbornene itself as well as any substituted norbornene(s), or substituted and unsubstituted higher cyclic derivatives thereof. Representative examples of such monomers include but not limited to bicyclo[2.2.2]oct-2-ene, 1,2,3,4,4a,5,8,8a-octahydro-1,4:5,8-dimethanonaphthalene, 1,4,4a,5,6,7,8,8a-octahydro-1,4-epoxy-5,8-methanonaphthalene, and the like.

As mentioned above, the "norbornene-type" monomeric compounds employed in this invention can be synthesized by any of the procedures known to one skilled in the art. Specifically, several of the starting materials used in the preparation of the first type of monomers used herein are known or are themselves commercially available. The first type of monomers employed herein as well as several of the precursor compounds may also be prepared by methods used to prepare similar compounds as reported in the literature and as further described herein. See for instance, U.S. Patent Application No. US2012/0056183 A1.

In general, an economical route for the preparation of first type of monomers of formula (I), wherein m=0, relies on the Diels-Alder addition reaction in which cyclopentadiene (CPD, IV) is reacted with a suitable dienophile of formula (V) or (VI) at suitable reaction temperatures which are typically at elevated temperatures to form the monomers of formula (I) or (III) generally shown by the following reaction scheme I:

Scheme I

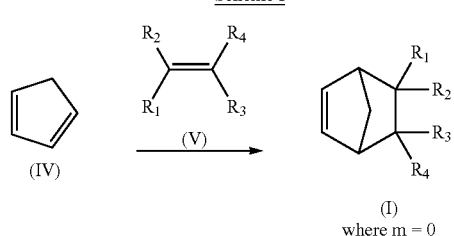

Wherein $R_1$, $R_2$, $R_3$ and $R_4$ are as defined herein.

Other monomeric compounds of formula (I), wherein m=1 or 2 can also be prepared similarly by the thermolysis of dicyclopentadiene (DCPD, VI) in the presence of a suitable dienophile of formula (V). In this approach, the compound of formula (I) formed itself acts as a dienophile and reacts with CPD, IV to give a compound of formula (I), where m=1, which can again be reacted with another molecule of CPD, IV to form a a compound of formula (I), where m=2, and so on, as shown in Scheme II:

Scheme II

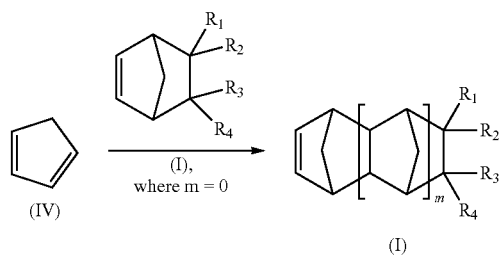

Wherein m, $R_1$, $R_2$, $R_3$ and $R_4$ are as defined herein. The dienophile of formula (V) are either generally available commercially or can be prepared following any of the known literature procedures.

Similarly, various other monomers of formulae (II) as described herein are also known in the art or are themselves commercially available. Also, monomers of formulae (II) can be synthesized by any of the procedures known to one skilled in the art.

Polymers

Embodiments in accordance with the present invention encompass polymers having at least one repeating unit derived from a norbornene-type monomer of formula (I) as defined herein, and at least one repeating unit derived from a maleic anhydride-type monomer of formula (II) as defined herein. It should be understood that various other types of monomers can also be used in addition to monomers of formulae (I) and (II) to form the polymers employed in this invention. Such polymers can be prepared by any of the methods known in the art. Generally, such polymers are prepared by free radical polymerization methods. See for example, U.S. Pat. No. 8,715,900, which discloses ring-opened maleic anhydride polymers with alcohols (ROMA) and copolymerized with a variety of norbornene monomers as described herein, pertinent portions of which are incorporated herein by reference. Various other methods, such as for example, vinyl addition polymerization using transition metal catalysts, such as for example, nickel or palladium can also be employed to make certain of the polymers employed to make the photoimageable compositions of this invention.

Photoimageable Compositions

Thus, in accordance with the practice of this invention there is provided a composition comprising:

a polymer comprising one or more distinct first repeating unit represented by to formula (IA), each of said first repeating unit is derived from a monomer of formula (I):

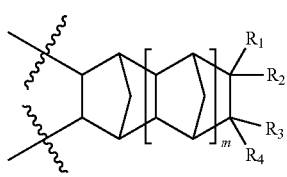

(IA)

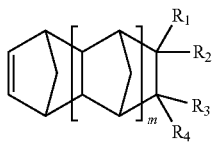

(I)

wherein:

represents a position at which the bonding takes place with another repeat unit;

m is an integer 0, 1 or 2;

$R_1$, $R_2$, $R_3$ and $R_4$ independently represents hydrogen, linear or branched $(C_1-C_{10})$alkyl, hydroxy$(C_1-C_{12})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{10})$heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$tricycloalkoxy, —$(CH_2)_a$—(O—$(CH_2)O_c$—O—$(C_1-C_4)$alkyl, where a, b and c are integers from 1 to 4, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy, $(C_1-C_6)$acyloxy and halogen; and a second repeating unit represented by formula (IIA), said second repeating unit is derived from a monomer of formula (II):

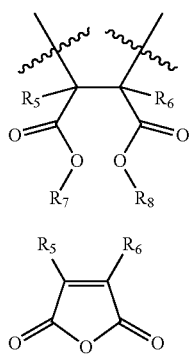

(IIA)

(II)

wherein:

$R_5$, $R_6$, $R_7$ and $R_8$ are each independently of one another hydrogen or linear or branched $(C_1-C_9)$alkyl, fluorinated or perfluorinated$(C_1-C_9)$alkyl, $(C_1-C_{12})$alkoxy$(C_1-C_{12})$alkyl and $(C_1-C_{12})$alkoxy$(C_1-C_{12})$alkoxy$(C_1-C_{12})$alkyl;

a photoacid generator;

a base; and a carrier solvent.

As noted, the polymers of this invention generally encompasses at least one monomer each of formulae (I) and (II). However, the polymer of this invention can encompass more than one monomer of formulae (I) distinct from one another. Similarly, more than one distinct monomer of formula (II) can also be used. Thus, the polymers used to form the photosensitive or photoimageable compositions of this invention can be a copolymer containing at least one monomer of formula (I) and one monomer of formula (II); a terpolymer containing at least one monomer each of formulae (I) and (II), and an additional distinct monomer selected either from formulae (I) or (II); a tetrapolymer containing at least one monomer each of formulae (I) and (II), and two additional distinct monomers selected from formulae (I) and/or (II); and so on. All such various combinations are part of this invention. Accordingly, in one of the embodiments of this invention, the composition of this invention encompasses a copolymer having one monomer each of formulae (I) and (II). In another embodiment of this invention, the composition of this invention encompasses a terpolymer having two distinct repeat units derived from two different monomers of formula (I) and one repeat unit derived from a monomer of formula (II). In yet another embodiment of this invention, the composition of this invention encompasses a tetrapolymer having three distinct repeat units derived from three different monomers of formula (I) and one repeat unit derived from a monomer of formula (II); or a tetrapolymer having two distinct repeat units derived from two different monomers of formula (I) and two distinct repeat units derived from two different monomers of formula (II).

In another embodiment, the composition of this invention encompasses a polymer, which further comprises a second distinct repeat unit of formula (IIB) derived from a monomer of formula (II):

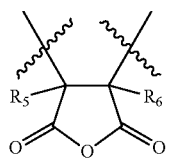

(IIB)

wherein $R_5$ and $R_6$ are as defined hereinabove.

In another embodiment, the composition of this invention encompasses a polymer, which comprises one or more distinct repeating units of formula (IA) having:

m is 0;

$R_1$, $R_2$, $R_3$ and $R_4$ are independently selected from the group consisting of hydrogen, methyl, ethyl, linear or branched $(C_1-C_{12})$alkyl, phenyl$(C_1-C_3)$alkyl, —$(CH_2)_a$—(O—$(CH_2)_b)_c$—O—$(C_1-C_4)$alkyl, where a is 1 or 2, b is 2 to 4 and c is 2 or 3.

In another embodiment, the composition of this invention encompasses a polymer having $R_5$ and $R_6$ independently of each other selected from hydrogen and methyl; and each $R_7$ and $R_8$ independently of one another selected from hydrogen, methyl, ethyl, n-propyl and n-butyl.

Useful monomers for embodiments in accordance with the present invention are described generally herein and are further described by the monomer and substituent structures provided herein. It should further be noted that the polymer of this invention generally encompasses equal molar amounts of repeat units derived from one or more monomers of formula (I) and repeat units derived from one or more monomers of formula (II). That is to say that the total molar amounts of one or more distinct types of monomers of formula (I) and the total molar amounts of one or more distinct types of monomers of formula (II) are generally the same. In this regard, the two distinct types of repeat units of formulae (IA), (IIA) or (IIB), if present, in the back bone of the polymer may be mostly alternating with norbornene-type repeating unit of formula (I) with one of maleic-anhydride repeat unit of formula (IIA) or (IIB). However, such repeat units of formulae (IA), (IIA) or (IIB) may also be randomly arranged or may form blocks, all such forms of polymers are part of this invention. In some embodiments, the norbornene-type repeat units are mostly alternating with the maleic-anhydride type repeat units. In other embodiments, such polymer compositions can encompass a polymer containing two or more distinct types of norbornene-type repeating units and at least one maleic anhydride-type repeating unit, or a polymer containing at least one norbornene-type repeating unit and two or more distinct types of maleic anhydride repeating units as further described herein.

Generally speaking, as to various possible substituents defined for $R_1$, $R_2$, $R_3$, $R_4$, it should be noted that such substituents can broadly be defined as "hydrocarbyl" group. As defined hereinabove, such definition of "hydrocarbyl" group includes any $C_1$ to $C_{30}$ alkyl, aryl, aralkyl, alkaryl, cycloalkyl, or heteroalkyl group. Representative alkyl groups include, but are not limited to, methyl, ethyl, propyl, isopropyl, butyl, isobutyl, sec-butyl, tert-butyl, pentyl, neopentyl, hexyl, heptyl, octyl, nonyl, and decyl. Representative cycloalkyl groups include, but are not limited to, adamantyl, cyclopentyl, cyclohexyl, and cyclooctyl. Representative aryl groups include, but are not limited to, phenyl, naphthyl, and anthracenyl. Representative aralkyl groups include, but are not limited to, benzyl and phenethyl. In addition, it should be noted that the hydrocarbyl groups mentioned above can be substituted, that is to say at least one of the hydrogen atoms can be replaced with, for example, $(C_1-C_{10})$alkyl, haloalkyl, perhaloalkyl, aryl, and/or cycloalkyl group(s). Representative substituted cycloalkyl groups include, among others, 4-t-butylcyclohexyl and 2-methyl-2-adamantyl. A non-limiting representative substituted aryl group is 4-t-butylphenyl.

Various types of norbornene-type monomers of formula (I) can be employed in order to form the polymers of this invention which contain the first repeat units derived therefrom. More specifically, any of the known norbornene-type monomers of formula (I) can be employed. For example, various such monomers are disclosed in U.S. Patent Publication No. US 2012/0056183 A1. Exemplary monomers which form such first repeating unit include but not limited to those monomers selected from the group consisting of:

norbornene (NB)

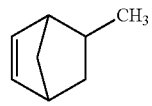

5-methylbicyclo[2.2.1]hept-2-ene (MeNB)

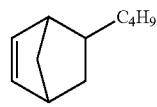

5-butylbicyclo[2.2.1]hept-2-ene (BuNB)

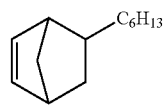

5-hexylbicyclo[2.2.1]hept-2-ene (HexNB)

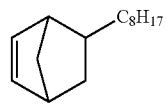

5-octylbicyclo[2.2.1]hept-2-ene (OctNB)

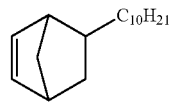

5-decylbicyclo[2.2.1]hept-2-ene (DecNB)

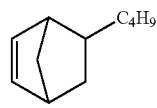

5-perfluorobutylbicyclo[2.2.1]hept-2-ene (NBC$_4$F$_9$)

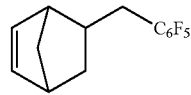

13

5-pentafluorobenzylbicyclo[2.2.1]hept-2-ene
(PFBNB)

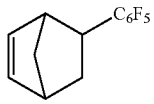

5-pentafluorophenylbicyclo[2.2.1]hept-2-ene
(PFPNB)

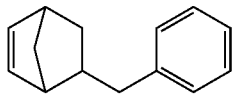 [SMILES: C1=CC2CC1CC2Cc1ccccc1]

5-benzylbicyclo[2.2.1]hept-2-ene (BzNB)

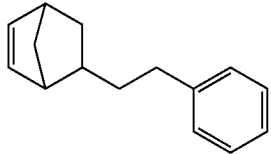 [SMILES: C1=CC2CC1CC2CCc1ccccc1]

5-phenethylbicyclo[2.2.1]hept-2-ene (PENB)

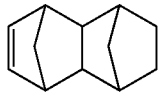

1,2,3,4,4a,5,8,8a-octahydro-1,4:5,8-dimethanonaphthalene (TD)

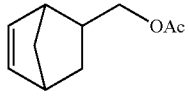 [SMILES: CC(=O)OCC1CC2C=CC1C2]

bicyclo[2.2.1]hept-5-en-2-ylmethyl acetate
(MeOAcNB)

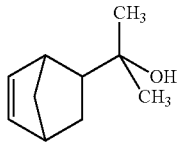

14

2-(bicyclo[2.2.1]hept-5-en-2-yl)propan-2-ol
(NBXOH)

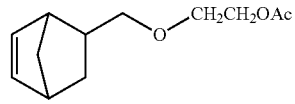

2-(bicyclo[2.2.1]hept-5-en-2-ylmethoxy)ethyl
acetate (NBCH$_2$GlyOAc)

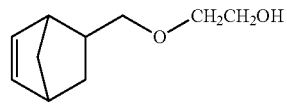

2-(bicyclo[2.2.1]hept-5-en-2-ylmethoxy)ethanol [(]
(NBCH$_2$GlyOH)

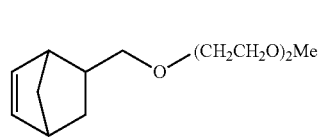

5-((2-(2-methoxyethoxy)ethoxy)methyl)bicyclo
[2.2.1]hept-2-ene (NBTON)

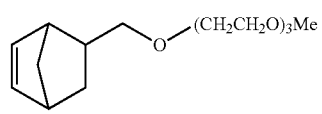

1-(bicyclo[2.2.1]hept-5-en-2-yl)-2,5,8,11-tetraoxadodecane (NBTODD)

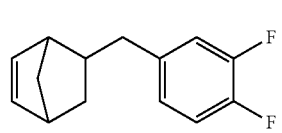 [SMILES: Fc1ccc(CC2CC3C=CC2C3)cc1F]

5-(3,4-difluorobenzyl)bicyclo[2.2.1]hept-2-ene
(NBCH$_2$C$_6$H$_3$F$_2$)

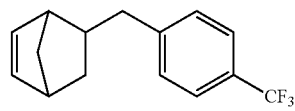 [SMILES: FC(F)(F)c1ccc(CC2CC3C=CC2C3)cc1]

5-(4-(trifluoromethyl)benzyl)bicyclo[2.2.1]hept-2-ene (NBCH$_2$C$_6$H$_4$CF$_3$)

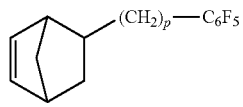

5-((perfluorophenyl)alkyl)bicyclo[2.2.1]hept-2-ene (NBalkylC$_6$F$_5$), where p=1 (methyl), 2 (ethyl), 3 (propyl), 4 (butyl), 5 (pentyl) or 6 (hexyl)

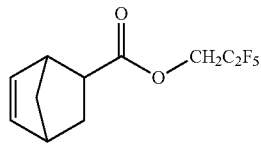

2,2,3,3,3-pentafluoropropyl bicyclo[2.2.1]hept-5-ene-2-carboxylate (PFPrCNB)

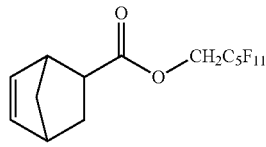

perfluoropentylmethyl bicyclo[2.2.1]hept-5-ene-2-carboxylate (PFPMeCNB)

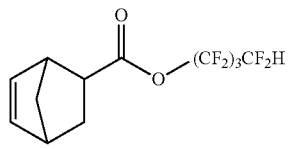

1,1,2,2,3,3,4,4-octafluorobutyl bicyclo[2.2.1]hept-5-ene-2-carboxylate (FOCHNB)

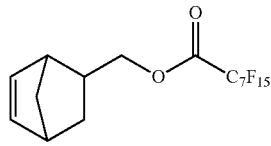

bicyclo[2.2.1]hept-5-en-2-ylmethyl perfluorooctanoate (CsPFAcNB); and

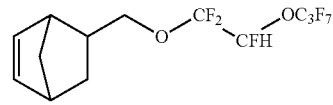

5((1,1,2-trifluoro-2-(perfluoropropoxy)ethoxy)methyl)bicyclo[2.2.1]hept-2-ene (PPVENB)

Accordingly, in one of the embodiments, the composition of this invention encompasses a polymer having one or more first repeating unit each of which is derived from a corresponding monomer selected from the group consisting of:

5-hexylbicyclo[2.2.1]hept-2-ene;
5-octylbicyclo[2.2.1]hept-2-ene;
5-decylbicyclo[2.2.1]hept-2-ene;
5-((2-(2-methoxyethoxy)ethoxy)methyl)bicyclo[2.2.1]hept-2-ene;
1-(bicyclo[2.2.1]hept-5-en-2-yl)-2,5,8,11-tetraoxadodecane;
5-benzylbicyclo[2.2.1]hept-2-ene; and
5-phenethylbicyclo[2.2.1]hept-2-ene.

Turning now to second repeating unit to form the polymer of this invention it is contemplated that any maleic anhydride derivative can be used as a monomer, including maleic anhydride itself. Exemplary monomers of such type include but not limited to those selected from the group consisting of:

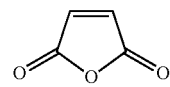

maleic anhydride

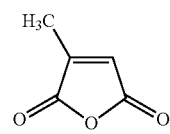

2-methyl-maleic anhydride
(3-methylfuran-2,5-dione)

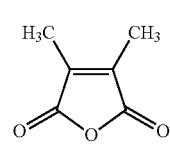

2,3-dimethyl-maleic anhydride
(3,4-dimethylfuran-2,5-dione)

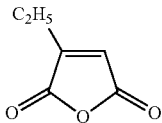

2-ethyl-maleic anhydride (3-ethylfuran-2,5-dione)

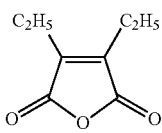

2,3-diethyl-maleic anhydride
(3,4-diethylfiwan-2,5-dione)

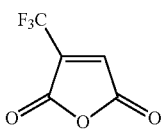

2-trifluoromethyl-maleic anhydride
(3-trifluoromethylfuran-2,5-dione)

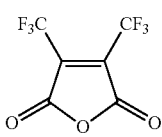

2,3-Bis(trifluoromethyl)-maleic anhydride (3,4-bis
(trifluoromethyl)furan-2,5-dione); and

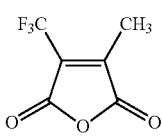

2-methyl-3-trifluoromethyl-maleic anhydride
(3-methyl-4-(trifluoromethyl)furan-2,5-dione)

In another embodiment, the composition of this invention encompasses a polymer having one or more second repeating unit each of which is derived from a corresponding monomer selected from the group consisting of:

maleic anhydride;
2-methyl-maleic anhydride (3-methylfuran-2,5-dione);
2,3-dimethyl-maleic anhydride (3,4-dimethylfuran-2,5-dione);
2-ethyl-maleic anhydride (3-ethylfuran-2,5-dione);
2,3-diethyl-maleic anhydride (3,4-diethylfuran-2,5-dione);
2-trifluoromethyl-maleic anhydride (3-trifluoromethylfuran-2,5-dione);
2,3-bis(trifluoromethyl)-maleic anhydride (3,4-bis(trifluoromethyl)furan-2,5-dione); and
2-methyl-3-trifluoromethyl-maleic anhydride (3-methyl-4-(trifluoromethyl)furan-2,5-dione).

Advantageously, as noted above, it has now been found that the polymers employed in this invention feature an alternating sequence of one or more of first type of repeat units of formulae (IA) with one or more repeat units of maleic anhydride of formulae (IIA) or (IIB), particularly if the polymer is made by a free radical polymerization as described herein. Thus, the polymers of this invention generally incorporate repeating units of formula (IA) from about 40 mole percent to about 60 mole percent. The remaining repeat units are being derived from a combination of repeat units of formulae (IIA) and (IIB).

Again, as noted above, one or more distinct types of repeat units of formula (IA) may be present in the polymer of this invention. Accordingly, in one of the embodiments the polymer of this invention contains only one type of repeat unit of formula (IA). In another embodiment, the polymer of this invention contains two distinctive types of repeat units of formula (IA). In other embodiments the polymer of this invention contains more than two distinctive types of repeat units of formula (IA). Similarly, various different types of repeat units of formulae (IIA) and (IIB) can be used to form the polymers of this invention.

As noted, the polymer as obtained above is then subjected to suitable reaction conditions to ring open the maleic anhydride repeat units of formula (IIB), the ROMA polymers employed in the compositions of this invention. Any of the known methods which would bring about such a ring opening can be employed in this method of the invention. Non-limiting examples of such ring opening reactions include reacting the polymer with a suitable alcohol optionally in the presence of a suitable base or an acid. Non-limiting examples of alcohols include methanol, ethanol, n-propanol, iso-propanol, n-butanol, iso-butanol, tert-butanol, pentanol, hexanol, octanol, fluoroalkanol, methoxyethanol, methoxyethoxymethanol, methoxyethoxyethanol, and the like. Non-limiting examples of base include sodium hydroxide, lithium hydroxide, potassium hydroxide, cesium hydroxide, ammonia, ammonium hydroxide, magnesium hydroxide, calcium hydroxide, barium hydroxide, and the like. Various other known organic bases can also be employed. Representative examples of which include, tetramethylammonium hydroxide (TMAH), tetraethylammonium hydroxide (TEAH), pyridine, imidazole, and the like. Non-limiting examples of acids include acetic acid, trifluoroacetic acid, sulfuric acid, hydrochloric acid, methanesulfonic acid, trifluoromethanesulfonic acid, p-toluenesulfonic acid, benzenesulfonic acid, and mixtures thereof. As noted, in some embodiments the ring opening can also be carried without any acid or base.

The aforementioned ring opening reactions can be carried out using any of the known methods in the art. Typically, such reactions are carried out in a suitable solvent or a mixture of solvents in the presence of a base and an alcohol. Examples of base and alcohol are already described above. Non-limiting examples of solvents include tetrahydrofuran (THF), acetonitrile, dimethylacetamide (DMAc), dimethyl sulfoxide (DMSO), N-methylpyrrolidone (NMP), propyleneglycol monomethylether acetate (PGMEA), ethyl acetate, methyl ethyl ketone (MEK), toluene, hexane, water, and mixtures thereof. The reaction can be carried out at suitable temperature including ambient, sub-ambient and super-ambient conditions. Typically, the reaction temperature employed is in the range of about 40 to 90° C. and in certain embodiments the temperature can be in the range of 50 to 80° C. and in some other embodiments it can be in the range of 60 to 70° C.

The ROMA polymers so formed in accordance with this invention, depending upon contacting with such aforementioned reagents will cause either complete or partial ring open of the maleic anhydride repeating units to form a repeat unit of formula (IIA). Thus, such ROMA polymers may have a randomly ordered repeat units of formula (IA), (IIA) and (IIB), wherein the repeat units of formula (IIA) may include a combination of diacid (i.e., both $R_7$ and $R_8$ are hydrogen), monoester (i.e., one of $R_7$ and $R_8$ is hydrogen) or a diester (i.e., both $R_7$ and $R_8$ are alkyl, and the like) depending upon the degree of esterification with the alcohol. Thus in accordance with this aspect of the embodiment of this invention, the ring opened portion of the maleic anhydride repeat unit of formula (IIA) is in the order of from about 1 mole percent to about 100 mole percent; in some other embodiments it is higher than 40 mole percent; in some other embodiments it is higher than 60 mole percent; and in some other embodiments it is higher than 80 mole percent. In some other embodiments more than 90 mole percent of maleic anhydride units are ring opened where one of $R_7$ and $R_8$ is hydrogen. That is, the polymer in these embodiments encompasses maleic anhydride repeat units of formula (IIA) where one of $R_7$ and $R_8$ is hydrogen. Accordingly, the ring opened maleic anhydride repeat unit may be partially hydrolyzed to mono-carboxylic acid (i.e., one of $R_7$ and $R_8$ is hydrogen) or fully hydrolyzed to di-carboxylic acid (i.e., both $R_7$ and $R_8$ are hydrogen). The amount of free acid present can be tailored by controlling the degree of esterification with an alcohol. Thus in one of the embodiments the amount of diacid present in the maleic anhydride repeat units of formula (IIA) is from about 0 mole percent to about 100 mole percent; in some other embodiments it is from about 20 mole percent to about 80 mole percent; in some other embodiments it is from about 40 mole percent to about 60 mole percent; and in some other embodiments it is from about 45 mole percent to about 55 mole percent. That is to say, when 50 mole percent of the repeat unit of formula (IIA) is diacid, the remaining portions of the repeat units are esterified, thus portions of the repeat units may be mono-esterified or di-esterified to give a cumulative total of 50% of the repeat units to be esterified.

Accordingly, the polymers employed in the compositions of this invention are therefore generally formed from the hydrolysis of the polymers containing the repeat units of formula (IA) and formula (IIB) (COMA), which after hydrolysis results in ring-opened polymers containing generally the repeat units of formula (IA) and (IIA), the ROMA polymers. The COMA and ROMA polymers as employed in this invention generally exhibit a weight average molecular weight ($M_w$) of at least about 2,000. In another embodiment, the polymer of this invention has a $M_w$ of at least about 6,000. In yet another embodiment, the polymer of this invention has a $M_w$ of at least about 10,000. In some other embodiments, the polymer of this invention has a $M_w$ of at least about 25,000. In some other embodiments, the polymer of this invention has a $M_w$ higher than 25,000. The weight average molecular weight ($M_w$) of the polymer can be determined by any of the known techniques, such as for example, by gel permeation chromatography (GPC) equipped with suitable detector and calibration standards, such as differential refractive index detector calibrated with narrow-distribution polystyrene standards.

Accordingly, any of the copolymers, terpolymers, tetrapolymers within the scope of the definition provided herein can be employed to form the compositions of this invention. Exemplary polymers without any limitations maybe enumerated as follows:

a copolymer of 5-phenethylbicyclo[2.2.1]kept-2-ene (PENB) and maleic anhydride in which maleic anhydride repeating unit is ring opened with methanol (50:50 molar ratio);

a copolymer of 5-phenethylbicyclo[2.2.1]hept-2-ene (PENB) and maleic anhydride in which maleic anhydride repeating unit is ring opened with ethanol (50:50 molar ratio); and a copolymer of 5-phenethylbicyclo[2.2.1]hept-2-ene (PENB) and maleic anhydride in which maleic anhydride repeating unit is ring opened with n-butanol (50:50 molar ratio).

As mentioned above, the polymer compositions of this invention further contains a photoacid generator (PAG). Any of the PAGs known to one skilled in the art which would bring about the desired results as further discussed herein can be employed in the composition of this invention. Broadly speaking, the PAG that can be employed in this invention is a nucleophilic halogenides (e.g., diphenyliodonium salt, diphenylfluoronium salt) and complex metal halide anions (e.g., triphenylsulfonium salts). Exemplary PAGs without any limitation include, (p-isopropylphenyl) (p-methylphenyl)-iodonium tetrakis(pentafluorophenyl) borate (DPI-TPFPB), available commercially under the trade name RHODORSIL™ Photoinitiator 2074 from Rhodia, Inc.; (2-(4-methoxynaphthalen-1-yl)-2-oxoethyl)dimethylsulfonium tetrakis(perfluorophenyl)borate (MNDS-TP-FPB), available commercially under the trade name TAG 382 from Toyo Inc.; tris(4-tert-butyl)phenyl)sulfonium tetrakis-(pentafluorophenyl)borate (TTBPS-TPFPB); tris(4-tert-butyl)phenyl)sulfonium hexafluorophosphate (TTBPS-HFP); triphenylsulfonium triflate (TPS-Tf); triazine (TAZ-101); triphenylsulfonium hexafluoroantimonate (TPS-103); triphenylsulfonium bis(perfluoromethanesulfonyl) imide (TPS-N1); di-(p-t-butyl) phenyliodonium bis(perfluoromethanesulfonyl) imide (DTBPI-N1); potassium tris(trifluoromethanesulfonyl) methanide, commercially available from Synquest Laboratories; di-(p-t-butylphenyl)iodonium tris(trifluoromethanesulfonyl)methanide (DTBPI-C1); diphenyliodonium hexafluorophosphate, diphenyliodonium hexafluorostibate, bis(4-(tert-butyl)phenyl)iodonium hexafluorophosphate, bis(4-(tert-butyl)phenyl)iodonium hexafluorostibate (DTBPI-Tf), diphenyliodonium trifluoromethanesulfonate, diphenyliodonium 1,1,2,2,3,3,4,4,4-nonafluorobutane-1-sulfonate; bis(4-(tert-butyl)phenyl)iodonium trifluoromethanesulfonate; and bis(4-(tert-butyl) phenyl)iodonium 1,1,2,2,3,3,4,4,4-nonafluorobutane-1-sulfonate; and combinations thereof.

In one of the embodiments of this invention the PAGs employed are the following:

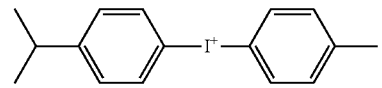

-continued

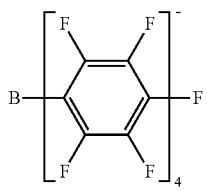

(p-isopropylphenyl)(p-methylphenyl)-iodonium tetrakis(pentafluorophenyl) borate (DPI-TPFPB)

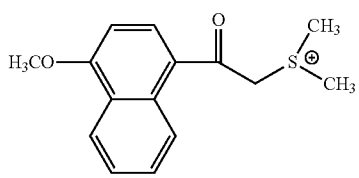

(2-(4-methoxynaphthalen-1-yl)-2-oxoethyl)dimethylsulfonium tetrakis(perfluorophenyl)borate (MNDS-TPFPB)

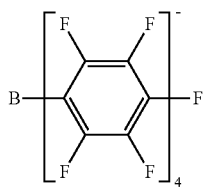

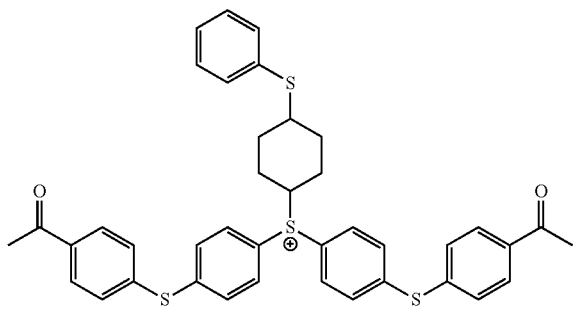

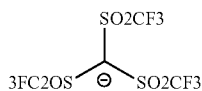

bis(4-((4-acetylphenyl)thio)phenyl)(4-(phenylthio)cyclohexyl)sulfonium tris((trifluoromethyl)sulfonyl)methanide (GSID26-A)

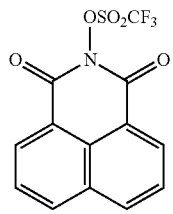

1,3-dioxo-1H-benzo[de]isoquinolin-2(3H)-yl trifluoromethanesulfonate (NIT); and

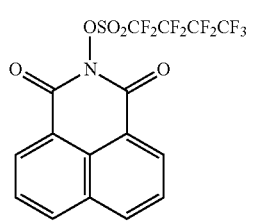

1,3-dioxo-1H-benzo[de]isoquinolin-2(3H)-yl 1,1,2,2,3,3,4,4,4-nonafluorobutane-1-sulfonate (NIN)

As further noted above, the compositions of this invention also include a base. Generally, any of the bases that would bring about the desirable results to form the photopatternable compositions can be employed herein. Although many different varieties of bases can be used, it has been advantageously found that the bases, which are solid at ambient conditions exhibiting higher than 100° C. melting point are more suitable. That is, solid bases having lower vapor pressure and oligomeric amines are suitable, among various other known bases. Other bases which can provide good quality films and retain thermo-mechanical properties are also suitable.

Illustrative examples of such a base, without any limitation may be enumerated as follows:

a compound of formula (III):

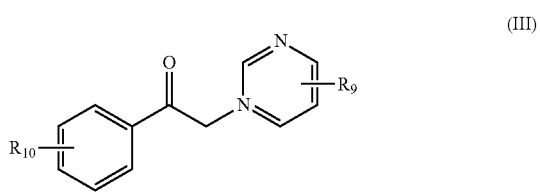

wherein $R_9$ and $R_{10}$ are the same or different and each independently of one another is selected from the group consisting of hydrogen, linear or branched ($C_1$-$C_{16}$)alkyl, ($C_6$-$C_{10}$)aryl, ($C_6$-$C_{10}$)aryl($C_1$-$C_3$)alkyl, hydroxy, halogen, linear or branched ($C_1$-$C_{12}$)alkoxy and ($C_6$-$C_{10}$)aryloxy;

a compound of the formula (IV):

$$H_2N-R_{12}-(O(CH_2)_d)_e-OR_{11} \quad (IV)$$

wherein
d is an integer from 1 to 4;
e is an integer from 5 to 50;
$R_{11}$ is selected from the group consisting of methyl, ethyl, linear or branched $(C_3-C_6)$alkyl; and
$R_{12}$ is substituted or unsubstituted $(C_1-C_4)$alkylene; and
a compound of the formula (V):

(V)

wherein
f is an integer from 25 to 100;
$R_{13}$ is selected from the group consisting of methyl, ethyl, linear or branched $(C_3-C_6)$alkyl; and
$R_{14}$ is substituted or unsubstituted $(C_1-C_4)$alkylene.

Specific examples of such a base can be selected from the group consisting of:

1-phenyl-2-(pyrimidin-1(6H)-yl)ethanone (N-BI)

where e is 8

O-(2-aminopropyl)-O'-(2-methoxyethyl) polypropyleneglycol (APMEPPG); and where f is 50

Amine Terminated poly(N-isopropylacrylamide) (PONIA-NH2)

Advantageously, photobase generators (PBGs) are another class of bases which can be used in the compositions of this invention. That is, PBG generates a base upon exposure to suitable radiation, where the generated base brings about the desired result as further described herein.

Accordingly, such examples of PBGs include without any limitation various carbamates that decompose upon exposure to suitable radiation releasing an amine, and various amine derivatives and suitable amine salts, among others. Other PBGs that can be employed include a carboxylic acid or a functional equivalent derivative thereof of an amine or its equivalent, which when exposed to a suitable radiation decomposes to release the free base. All of such compounds as single component or mixtures in any combination thereof can be used in the composition of this invention.

More specifically, the following PBGs may be suitable for use in the compositions of this invention, without any limitation:

a compound of formula (VI):

(VI)

a compound of formula (VII):

(VII)

a compound of formula (VIII):

(VIII)

a compound of formula (IXA), (IXB) and (IXC):

(IXA)

-continued

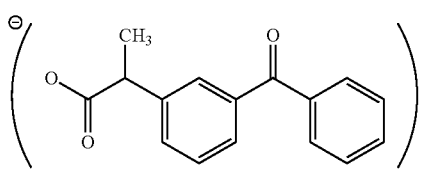
(IXB)

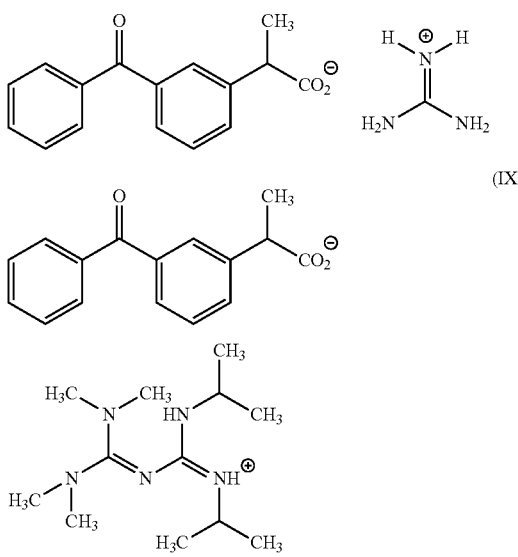
(IXC)

wherein $R_{15}$, $R_{16}$ and $R_{17}$ are the same or different and each independently of one another is selected from the group consisting of hydrogen, linear or branched $(C_1-C_{16})$alkyl, $(C_6-C_{10})$aryl, $(C_6-C_{10})$aryl$(C_1-C_3)$alkyl, hydroxy, halogen, linear or branched $(C_1-C_{12})$alkoxy and $(C_6-C_{10})$aryloxy; and $R_{18}$ and $R_{19}$ each independently of one another selected from the group consisting of hydrogen, linear or branched $(C_1-C_8)$alkyl and $(C_6-C_{10})$aryl; or $R_{18}$ and $R_{19}$ taken together with the nitrogen atom to which they are attached form a 5 to 7 membered monocyclic ring or 6 to 12 membered bicyclic ring, said rings optionally containing one or more additional heteroatoms selected from O and N, and said rings optionally substituted with linear or branched $(C_1-C_5)$alkyl, $(C_6-C_{10})$aryl, halogen, hydroxy, linear or branched $(C_1-C_8)$alkoxy and $(C_6-C_{10})$aryloxy.

In one embodiment the PBG that is employed in the composition of this invention is selected from the group consisting of:

a compound of formula (VI):

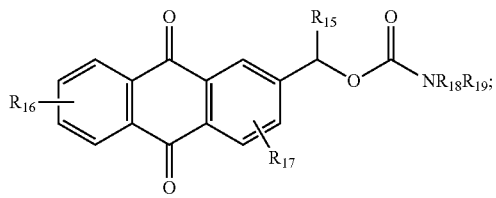
(VI)

and a compound of formula (VIII):

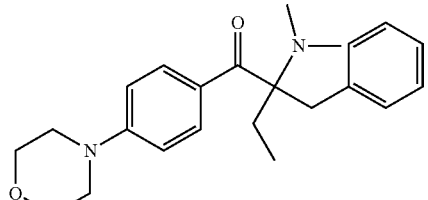
(VIII)

Wherein, $R_{15}$, $R_{16}$ and $R_{17}$ are the same or different and each independently of one another is selected from the group consisting of hydrogen, methyl, ethyl, n-propyl, iso-propyl, n-butyl and phenyl; and $R_{18}$ and $R_{19}$ each independently of one another selected from the group consisting of hydrogen, methyl, ethyl, n-propyl, iso-propyl and n-butyl; or $R_{18}$ and $R_{19}$ taken together with the nitrogen atom to which they are attached form a pyridine or pyrimidinyl ring.

Exemplary PBGs without any limitation that can used in the compositions of this invention are selected from the group consisting of:

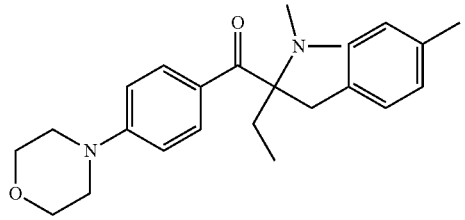 [SMILES: CCC(Cc1ccc(C)cc1)(C(=O)c1ccc(N2CCOCC2)cc1)N(C)C]

2-Benzyl-2-(Dimethylamino)-1-(4-Morpholinophenyl)Butan-1-One, Commercially Available as IRGACURE® 369 from BASF

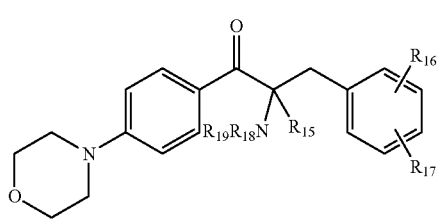

2-(dimethylamino)-2-(4-methylbenzyl)-1-(4-morpholinophenyl)butan-1-one, Commercially Available as IRGACURE® 379 from BASF

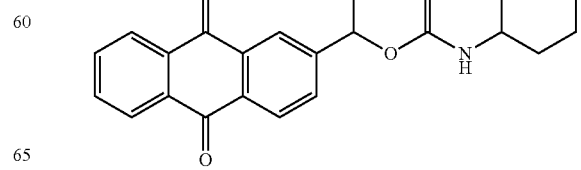

1-(9,10-dioxo-9,10-dihydroanthracen-2-yl)ethyl cyclohexylcarbamate, Commercially Available from Wako Pure Chemical Industries, Ltd., Japan

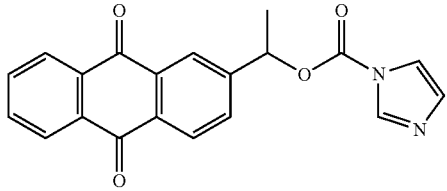 [SMILES: CC(OC(=O)n1ccnc1)c1ccc2c(c1)C(=O)c1ccccc1C2=O]

1-(9,10-dioxo-9,10-dihydroanthracen-2-yl)ethyl 1H-imidazole-1-carboxylate, Also Known as 1-(anthraquinon-2-yl)ethyl imidazolecarboxylate, Commercially Available as WPBG-140 from Wako Pure Chemical Industries, Ltd., Japan; and

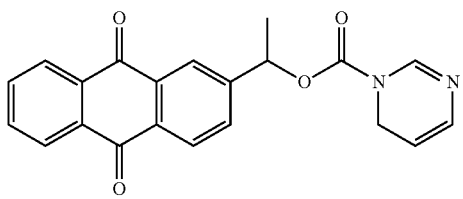 [SMILES: CC(OC(=O)N1C=NC=CC1)c1ccc2c(c1)C(=O)c1ccccc1C2=O]

1-(9,10-dioxo-9,10-dihydroanthracen-2-yl)ethyl pyrimidine-1(6H)-carboxylate

Surprisingly, it has now been found that by employing a suitable combination of one or more PAGs as described herein and one or more base as described herein, it is now possible to form a composition which when image-wise exposed to a suitable actinic radiation forms high resolution images. This is presumably due to the fact that the exposed regions forms an acid from the PAG, which is neutralized by the base present in the composition (and/or formed by a PBG after exposure), thus increasing the dissolution rate (DR) of the exposed regions even after post exposure bake (PEB). On the other hand, in the unexposed regions the base present in the composition seem to facilitate the ring closure of the maleic anhydride repeat units (and/or facilitate a reaction between carboxylic acid moiety from the polymer and an epoxy cross-linker incorporated into the composition as disclosed herein), thus transforming the ROMA polymers into COMA polymers (and/or cross-linked esters when an epoxy cross-linker is present) thereby lowering the dissolution rate (DR) of the unexposed region, thus providing an enhanced dissolution contrast between the exposed and unexposed regions resulting in high resolution images. This is further described in Scheme I.

Accordingly, the compositions of this invention are capable of forming films useful as self-imageable layers in the manufacture of microelectronic and optoelectronic devices. That is to say that when image-wise exposed to actinic radiation, such layers (or films) can be developed to form a patterned film, where such pattern is reflective of the image through which the film was exposed.

SCHEME I

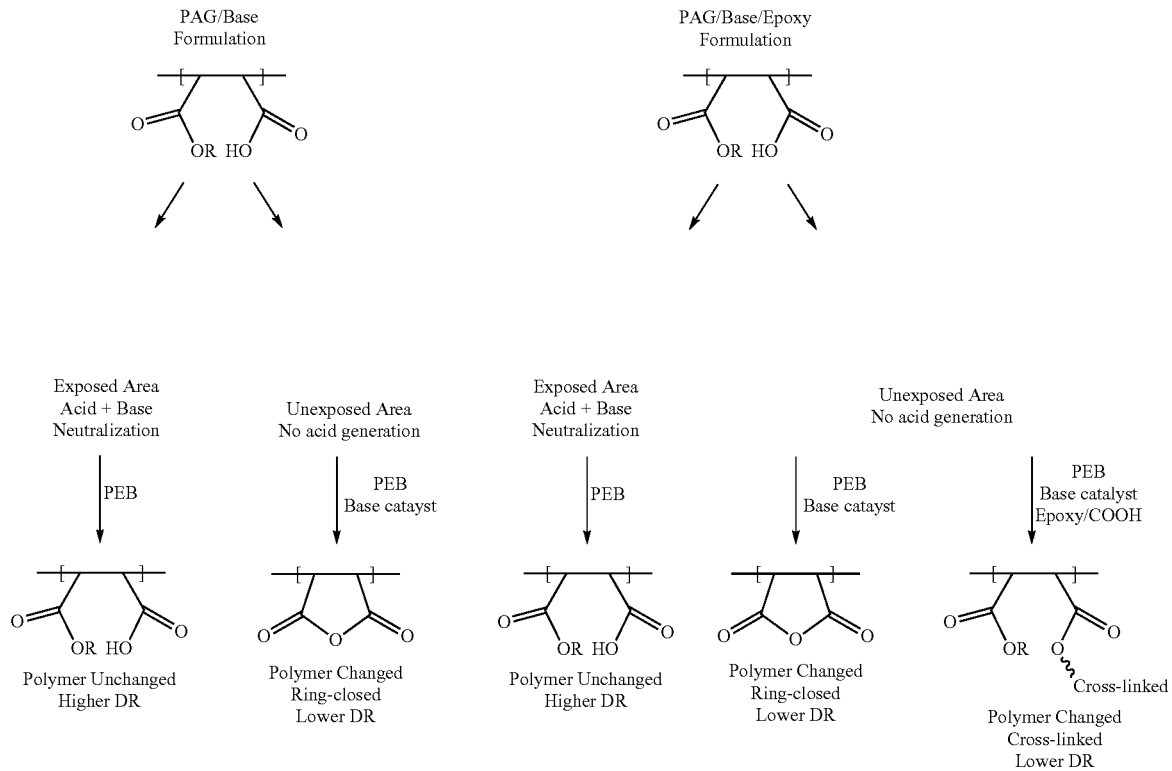

In this manner, structures can be provided that are, or are to become, a part of such microelectronic and/or optoelectronic devices. For example, such films may be useful as low-K dielectric layers in liquid crystal displays or in microelectronic devices. It will be noted that such examples are only a few of the many uses for such a self-imageable film, and such examples do not serve to limit the scope of such films or the polymers and polymer compositions that are used to form them.

Advantageously, it has now been found that polymer compositions of this invention to provide several desirable properties especially when compared to several of the polymers reported in the literature for similar applications. For instance, it has been observed that several of the styrene-maleic anhydride copolymers exhibit very high dark field loss (DFL) making them less desirable for positive tone (PT) applications. As used herein, the term DFL or the unexposed area film thickness loss is a measure of the film thickness loss after image-wise exposure to suitable actinic radiation and developing in a suitable developer. That is, the polymer compositions of this invention are cast into films, the film thicknesses before and after development in an unexposed region of the film are measured and reported as percent loss of the film thickness in areas of the film that was not exposed to the radiation. Generally, higher the percent of DFL, poorer the performance of the polymer composition, which means that the unexposed areas of the film are more susceptible to the developed and thus dissolves in the developer. In addition, the measured DFL also depends on the developed time employed. Generally, longer the develop time higher the DFL.

Surprisingly, the compositions of this invention exhibit very low DFL in that the unexposed area of the film is not lost even at higher develop time. Accordingly, in some embodiments of this invention the DFL of the compositions may be less than about 20 percent; in some other embodiments DFL can be less than 25 percent; and in some other embodiments the DFL may be in the range of from about 0 percent to 30 percent. At the same time the develop time for the compositions of this invention can generally range from about 10 seconds to about 80 seconds; in some other embodiments the develop time can range from about 20 seconds to about 60 seconds; and in some other embodiments the develop time can range from about 30 seconds to about 40 seconds.

In addition, advantageously it has also been found that the compositions of this invention exhibit excellent dissolution rate in the developing solvent, such as for example, aqueous based alkali developer, including tetramethylammonium hydroxide (TMAH). This can further be tailored based on the molar content of the free carboxylic acid group present in the maleic anhydride repeat units of formula (IIA) in the polymer. Generally, it has now been found that by judicious selection of the molar ratio of ring opened maleic anhydride repeat units it is now possible to control the dissolution rate of the composition of this invention to the desirable range. Furthermore, the compositions of this invention retain much needed lithographic resolution, photospeed and high degree of chemical resistance, among various other desirable properties.

In addition, various other additives/components can be added to the composition of this invention, which is used for the formation of the photoimageable layer such that its mechanical and other properties can be tailored as desired. Also, other additives can be used to alter the processability, which include increase the stability of the polymer to thermal and/or light radiation. In this regard, the additives can include, but are not limited to, crosslinkers, photosensitizers, antioxidants, adhesion promoters, surfactants, thermal acid and/or thermal base generator, and the like. Any of these additives can be used as a mixture in any combination thereof.

As summarized in Scheme I above, surprisingly, it has now been found that employing suitable crosslinking compound it is now possible to improve quality of the images formed from the compositions of this invention. That is, by employing a suitable crosslinker such as an epoxy compound it is now possible to further decrease the dissolution rate of the unexposed areas thus resulting in very high resolution images as further illustrated by specific examples that follow. Any of the crosslinking compounds known in the art that would bring about such an effect can be employed to form the compositions of this invention, such as for example epoxy compounds. Exemplary epoxies and other cross-linking additives, as mentioned above, include, but are not limited to, bisphenol A epoxy resin (LX-01—where n=1 to 2, Daiso Chemical Co., Osaka, Japan), 2,2'-((((1-(4-(2-(4-(oxiran-2-ylmethoxy)phenyl)propan-2-yl)phenyl)ethane-1,1-diyl)bis(4,1-phenylene))bis(oxy))bis(methylene))bis(oxirane) (Techmore VG3101L—Mitsui Chemical Inc., also available under the tradename EPON™ 828 from Momentive Specialty Chemicals Inc.), trimethylolpropane triglycidylether (TMPTGE—CVC Specialty Chemicals, Inc.), 1,1,3,3,5,5-hexamethyl-1,5-bis(3-(oxiran-2-ylmethoxy)propyl)trisiloxane (DMS-E09—Gelest, Inc.), liquid epoxy resins (D.E.R.™ 732, where n=8 to 10, and D.E.R.™ 736, where n=4 to 6—both from Dow Chemical Company), bis(4-(oxiran-2-ylmethoxy)phenyl)methane (EPON™ 862, Hexion Specialty Chemicals, Inc.), triglycidyl ether of poly(oxypropylene)epoxide ether of glycerol (commercially available as Heloxy 84 or GE-36 from Momentive Specialty Chemicals Inc.), 2-((4-(tert-butyl)phenoxy)methyl)oxirane (commercially available as Heloxy 65 from Momentive Specialty Chemicals Inc.) and silicone modified epoxy compound (commercially available as BY16-115 from Toray-Dow Corning Silicone Co., Ltd.) as shown below:

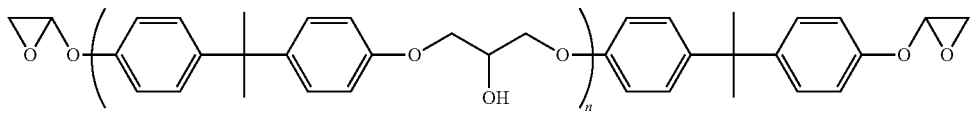

LX-01

-continued

TMPTGE

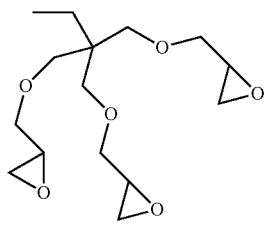

DMS-E09

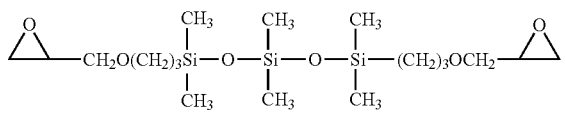

Techmore VG3101L

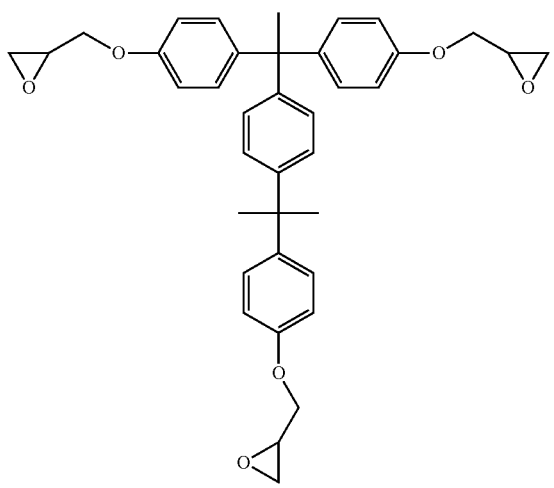

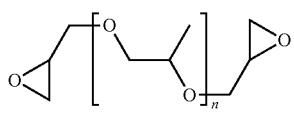

D.E.R.™ 732, where n=8 to 10 and D.E.R.™ 736, where n=4 to 6

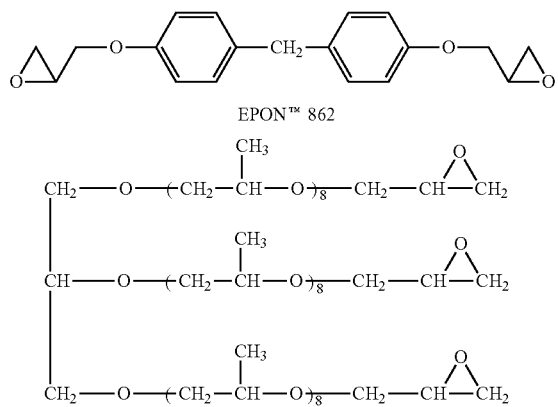

EPON™ 862 triglycidyl ether of poly(oxypropylene)epoxide ether of glycerol, Commercially Available as Heloxy 84 or GE-36 from Momentive Specialty Chemicals Inc.

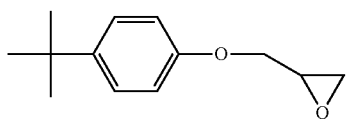

2-((4-(tert-butyl)phenoxy)methyl)oxirane, Commercially Available as Heloxy 65 from Momentive Specialty Chemicals Inc.; and Silicone Modified Epoxy Compound Commercially Available as BY16-115 from Toray-Dow Corning Silicone Co., Ltd.

Still other exemplary epoxy resins or cross-linking additives include, among others Araldite MT0163 and Araldite CY179 (manufactured by Ciba Geigy); and EHPE-3150, Epolite GT300 and (manufactured by Daicel Chemical).

In one embodiment of the composition of this invention the epoxies that can be used in the composition of this invention without any limitation is selected from the group consisting of:
 triglycidyl ether of poly(oxypropylene)epoxide ether of glycerol;
 trimethylolpropane triglycidylether;
 bisphenol A epichlorohydrin based epoxy resin;
 polypropylene glycol epichlorohydrin based epoxy resin (D.E.R.™ 732);

bis(4-(oxiran-2-ylmethoxy)phenyl)methane (EPON 862); glycidyl ether of para-tertiary butyl phenol (Heloxy 65); polyethylene glycol diglycidyl ether (PEGDGE); and polypropylene glycol diglycidyl ether (PPGDGE); and a mixture in any combination thereof.

The amount of epoxy compound employed may vary depending upon the intended result. For example, the amount can vary generally from about 0 to 60 parts by weight of the polymer and typically from about 2 to about 30 parts by weight, although other advantageous amounts of such materials are also appropriate and within the scope of the present invention. In addition, one or more different types of epoxy compounds as enumerated herein can be used in the composition of this invention and the amounts of each can thus be varied as needed.

Advantageously, as noted, it has now been found that judicious selection of the epoxy compound in the compositions of this invention may offer certain unexpected benefits. For instance, it has now been found that epoxy compounds having certain desirable epoxy equivalent weight and Log P offers certain surprising benefits. As used herein "Log P" is a measure of the partition-coefficient (P), that is, the ratio of concentrations of a compound in a mixture of two immiscible phases at equilibrium (water and 1-octanol). Generally, lower the Log P value higher the miscibility of such an epoxy compound in water. Such benefits include, among other things, improved DFL properties and thermal reflow properties. These features become more apparent from the specific examples that follow. It should further be noted that various benefits obtained from this invention depends on many factors as already described herein and some of which may be readily appreciated by one of skill in the art. Accordingly, in some embodiments the photosensitive compositions of this invention contains an epoxy compound having an epoxy equivalent weight higher than about 200. In other embodiments such epoxy equivalent weight may range from about 200 to 400 or higher. Further, Log P values of such epoxy compounds may be in the range of from about −0.3 to about −0.8; in other embodiments such Log P values are from about −0.4 to about −0.6. In some embodiments the epoxy compound is having an equivalent weight of about 300 to 400 and Log P of about −0.3 to −0.4.

It will be understood that exemplary embodiments of the present invention, can include other suitable components and/or materials such as are necessary for formulating and using the polymer compositions in accordance with the present invention. Such other suitable components and/or materials include one or more components selected from sensitizer components, solvents, catalyst scavengers, stabilizers, reactive diluents, and the like.

The polymer compositions in accordance with the present invention may further contain optional components as may be useful for the purpose of improving properties of both the composition and the resulting layer, for example the sensitivity of the composition to a desired wavelength of exposure radiation. Examples of such optional components include various additives such as a dissolution promoter, a surfactant, a silane coupling agent, a leveling agent, an antioxidant, a fire retardant, a plasticizer, a crosslinking agent or the like. Such additives include, but are not limited to, bisphenol A and 5-norbornene-2,3-dicarboxylic acid as a dissolution promoter, a silicone surfactant such as TSF4452 (Toshiba Silicone Co., Ltd) or any other suitable surfactant such as Megaface F-556, a nonionic or anionic fluorinated oligomer with hydrophilic and lipophilic group from DIC Corp., a silane coupling agent such as γ-aminopropyl triethoxysilane, a leveling agent, such as γ-(methacryloyloxy propyl) trimethoxysilane, antioxidants such as pentaerythritol tetrakis(3-(3,5-di-tert-butyl-4-hydroxyphenyl)propionate) (IRGANOX™ 1010 from BASF), 3,5-bis(1,1-dimethylethyl)-4-hydroxy-octadecyl ester benzenepropanoic acid (IRGANOX™ 1076 from BASF) and thiodiethylene bis[3-(3,5-di-tert.-butyl-4-hydroxy-phenyl)propionate] (IRGANOX™ 1035 from BASF), a fire retardant such as a trialkyl phosphate or other organic phosphoric compound and a plasticizer such as, poly(propylene glycol).

In addition, various other additives/components can be added to the composition of this invention, which is used for the formation of the photoimageable layer such that its mechanical and other properties can be tailored as desired. Also, other additives can be used to alter the processability, which include increase the stability of the polymer to thermal and/or light radiation. In this regard, the additives can include, but are not limited to, crosslinking agents, adhesion promoters, and the like. Non-limiting examples of such compounds are selected from the group consisting of the following, commercially available materials are indicated by such commercial names.

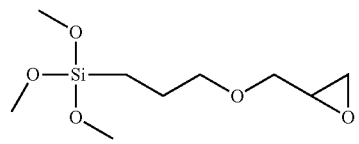

trimethoxy(3-(oxiran-2-ylmethoxy)propyl)silane, also commonly known as 3-glycidoxypropyl trimethoxysilane (KBM-403E from Shin-Etsu Chemical Co., Ltd.)

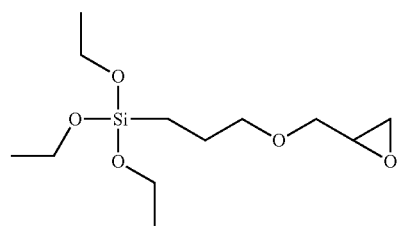 [SMILES: CCO[Si](CCCOCC1CO1)(OCC)OCC]

triethoxy(3-(oxiran-2-ylmethoxy)propyl)silane, also commonly known as 3-glycidoxypropyl triethoxysilane (KBE-403 from Shin-Etsu Chemical Co., Ltd.)

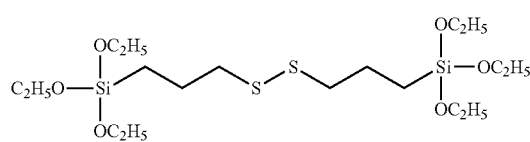

35

((triethoxysilyl)propyl)disulfide (Si-75 or Si-266 from Evonik)

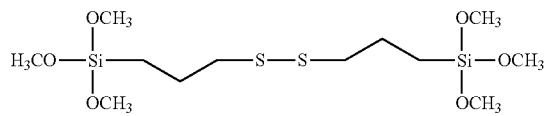

((trimethoxysilyl)propyl)disulfide

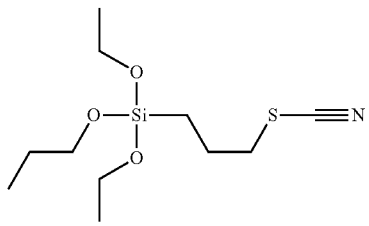 [SMILES: CCCO[Si](CCCSC#N)(OCC)OCC]

Diethoxy(Propoxy)(3-Thiocyanatopropyl)Silane, Commercially Available as SIT-7908.0 from Gelest

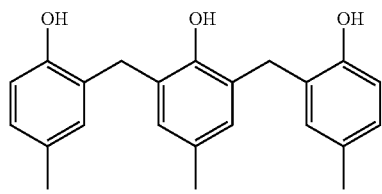 [SMILES: Cc1ccc(O)c(Cc2cc(C)cc(Cc3cc(C)ccc3O)c2O)c1]

2,2'-((2-hydroxy-5-methyl-1,3-phenylene)bis(methylene))bis(4-methylphenol) (AO-80 from TCI Japan)

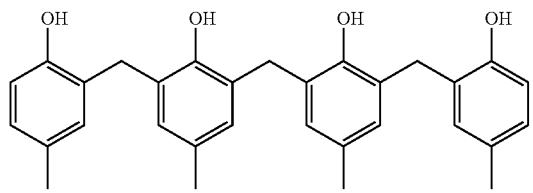 [SMILES: Cc1ccc(O)c(Cc2cc(C)cc(Cc3cc(C)cc(Cc4cc(C)ccc4O)c3O)c2O)c1]

6,6'-methylenebis(2-(2-hydroxy-5-methylbenzyl)-4-methylphenol) (4-PC)

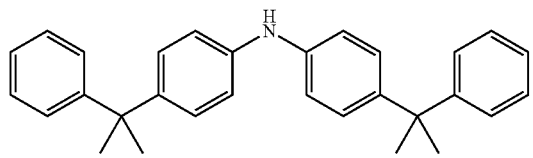 [SMILES: CC(C)(c1ccccc1)c1ccc(Nc2ccc(C(C)(C)c3ccccc3)cc2)cc1]

36

Bis(4-(2-Phenylpropan-2-Yl)Phenyl)Amine, Commercially Available as Naugard-445 from Addivant

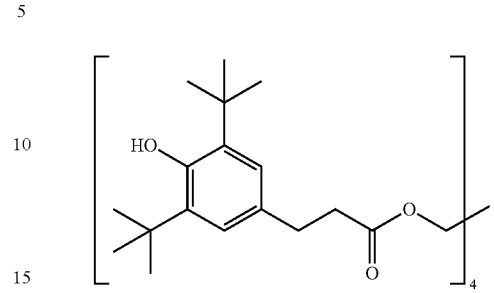

pentaerythritol tettakis(3-(3,5-di-tert-butyl-4-hydroxyphenyl)propionate) (Irganox 1010 from BASF)

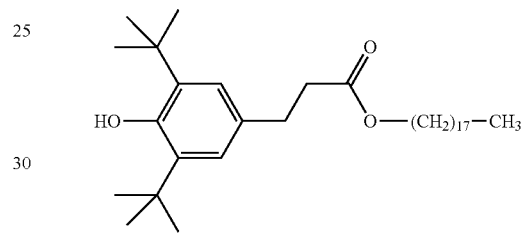

3,5-bis(1,1-dimethylethyl)-4-hydroxy-octadecyl ester benzenepropanoic acid (Irganox 1076 from BASF); and

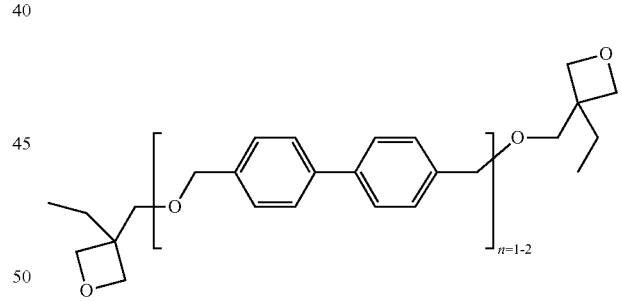

3,3'-[[1,1'-biphenyl]-4,4'-diylbis(methyleneoxymethylene)]bis[3-ethyl-oxetane]

In the embodiments of the present invention, these components are generally dissolved in a solvent and prepared into a varnish form to be used. As a solvent, there may be used N-methyl-2-pyrrolidone (NMP), γ-butyrolactone (GBL), N,N-dimethylacetamide (DMAc), dimethylsulfoxide (DMSO), diethyleneglycol dimethyl ether, diethyleneglycol diethylether, diethyleneglycol dibutylether, propyleneglycol monomethylether (PGME), dipropylene glycol monomethylether, propyleneglycol monomethylether acetate (PGMEA), methyl lactate, ethyl lactate, butyl lactate, methyl ethyl ketone (MEK), methyl amyl ketone (MAK), cyclohexanone, tetrahydrofuran, methyl-1,3-butyleneglycolacetate, 1,3-butyleneglycol-3-monomethylether, ethyl pyruvate, ethyl pyruvate, methyl-3-methoxypropionate or the like. They may be used solely or mixed by optionally selecting two or more kinds.

In one embodiment of the composition of this invention, the solvent used in forming the composition is selected from the group consisting of propyleneglycol monomethylether acetate (PGMEA), gamma-butyrolactone (GBL) and N-methylpyrrolidone (NMP) and a mixture in any combination thereof.

As mentioned above, some embodiments of the present invention encompass structures, such as optoelectronic structures, which include at least one self-imageable layer formed from a film of a polymer composition embodiment in accordance with the present invention.

The aforementioned structure embodiments of the present invention are readily formed by first casting or applying a polymer composition over an appropriate substrate to form a layer or a film thereof, then heating the substrate to an appropriate temperature for an appropriate time, where such time and temperature are sufficient to remove essentially all of the casting solvent of such composition. After such first heating, the layer is image-wise exposed to an appropriate wavelength of actinic radiation. As described hereinabove, the aforementioned image-wise exposure causes the PAG contained in exposed portions of the layer to undergo a chemical reaction to form a free acid that enhances the dissolution rate of such exposed portions to an aqueous base solution (generally a solution of tetramethylammonium hydroxide (TMAH)). In this manner, such exposed portions are removed and unexposed portions remain. Next a second heating is performed to cause ring closure of the portions of the polymer and/or cross-linking with the epoxy additive, if present, thus essentially "curing" the polymer of such unexposed portions to form an aforementioned structure embodiment of the present invention.

It should be noted again that the second heating step, post exposure bake (PEB) is performed for the imaged and developed layer. In this step of second heating, the thermal curing of the polymer layer can be achieved with the added additives, such as epoxies and/or other crosslinking agents as described herein.

Accordingly, there is further provided a cured product obtained by curing the composition of this invention as described herein. In a further embodiment of this invention there is also provided an optoelectronic or microelectronic device encompassing the cured product of this invention, which is having a dielectric constant of 3.2 or less at 1 MHz.

The following examples, without being limiting in nature, illustrate methods for making composition embodiments in accordance with the present invention.

It should further be noted that the following examples are detailed descriptions of methods of preparation and use of certain compounds/monomers, polymers and compositions of the present invention. The detailed preparations fall within the scope of, and serve to exemplify, the more generally described methods of preparation set forth above. The examples are presented for illustrative purposes only, and are not intended as a restriction on the scope of the invention. As used in the examples and throughout the specification the ratio of monomer to catalyst is based on a mole to mole basis.

EXAMPLES

General

The following definitions have been used in the Examples that follow unless otherwise indicated:

PENB: 5-phenethylbicyclo[2.2.1]hept-2-ene; MA: maleic anhydride; PBG-1: Irgacure 369-2-benzyl-2-(dimethylamino)-1-(4-morpholinophenyl)butan-1-one; PBG-2: WPBG-140-1-(anthraquinon-2-yl)ethyl imidazolecarboxylate; Base-1: 1-phenyl-2-(pyrimidin-1(6H)-yl)ethanone; Base-2: O-(2-aminopropyl)-O'-(2-methoxyethyl) polypropyleneglycol; Base-3: amine terminated poly(N-isopropylacrylamide); PAG-1: GSID26-A-bis(4-((4-acetylphenyl)thio)phenyl)(4-(phenylthio)cyclohexyl)sulfonium tris((trifluoromethyl)sulfonyl)methanide; PAG-2: 1,3-dioxo-1H-benzo[de]isoquinolin-2(3H)-yl trifluoromethanesulfonate; PAG-3: 1,3-dioxo-1H-benzo[de]isoquinolin-2(3H)-yl 1,1,2,2,3,3,4,4,4-nonafluorobutane-1-sulfonate; THF: tetrahydrofuran; EtOAc: ethyl acetate; MeOH: methanol; NMP: N-methyl-2-pyrrolidone; PGMEA: propyleneglycol monomethylether acetate; TMPTGE: trimethylolpropane triglycidylether; SIT-7908.0: diethoxy(propoxy)(3-thiocyanatopropyl)silane; Si-75: ((triethoxysilyl)propyl)disulfide; KBM-403E: 3-glycidoxypropyl trimethoxysilane; GE-36: triglycidyl ether of poly(oxypropylene)epoxide ether of glycerol; Naugard-445: bis(4-(2-phenylpropan-2-yl)phenyl)amine; Megaface F-556: fluorine based oligomer with hydrophilic and lipophilic group from DIC Corp.; HPLC: high performance liquid chromatography; GPC: gel permeation chromatography; Mw: weight average molecular weight; Mn: number average molecular weight; PDI: polydispersity index; pphr: parts per hundred resin; FT-IR: Fourier transform-infrared; NMR: nuclear magnetic resonance; TGA: thermogravimetric analysis.

Polymers

The polymers used to form the photosensitive compositions of this invention are generally known in the literature and are prepared in accordance with the well-known literature procedures. See for example, the U.S. Pat. No. 8,715,900 for all synthetic procedures related to ROMA polymers used to form the formulations of this invention.

Photoimageable Compositions

The following examples illustrate formation of the various compositions of this invention containing a polymer, photo-acid generator, photo-base generator and/or base with a variety of other components/additives as described herein.

Examples 1

A fully ring opened copolymer (ROMA) having the monomer composition of 50:50 molar ratio of PENB/MA ring opened with methanol ($M_w$ 8,700 and PDI 2.0, having substantially the repeat units of formula (IIA) where $R_7$ is methyl and $R_8$ is hydrogen) (100 parts resin) was dissolved in GBL (150 parts) having the specific amounts of additives, expressed as parts per hundred resin (pphr), PAG-2 (2 pphr) as a photo-acid generator, Base-1 (0.5 pphr) as a base additive, Base-3 (15 pphr) as a base additive, KBM-403E (3 pphr) as the adhesion promoter and GBL (300 pphr) were mixed in an appropriately sized amber HDPE bottle. The mixture was rolled for 18 hours to produce a homogeneous solution. Particle contamination was removed by filtering the polymer solution through a 1 μm pore polytetrafluoroethylene (PTFE) disc filter, the filtered polymer solution was collected in a low particle HDPE amber bottle and the resulting solution stored at 5° C.

Examples 2-5

In Examples 2-5, the procedures of Example 1 was substantially repeated except that TMPTGE (30 pphr) as a crosslinking agent was added to these compositions, and in addition the following modifications were made. PAG-2 was replaced with PAG-3 (3 pphr) for Example 3, with PAG-4 (3 pphr) for Example 4 and PAG-5 (3 pphr) for Example 5. The mixture thus formed in each of these Examples was rolled for 18 hours to produce a homogeneous solution. Particle contamination was removed by filtering the polymer solution through a 1 µm pore polytetrafluoroethylene (PTFE) disc filter, the filtered polymer solution was collected in a low particle HDPE amber bottle and the resulting solution stored at 5° C.

Example 6

A fully ring opened, ROMA, copolymer having the monomer composition of 50:50 molar ratio of PENB/MA ring opened with methanol ($M_w$ 8,600 and PDI 1.9, having substantially the repeat units of formula (IIA) where $R_7$ is methyl and $R_8$ is hydrogen) (100 parts resin) was dissolved in PGMEA (800 parts) having the specific amounts of additives, expressed as parts per hundred resin (pphr), PAG-1 (5 pphr) as a photo-acid generator, PBG-1 (5 pphr) as a photo-base generator, TMPTGE (40 pphr) as a crosslinking agent, KBM-403E (3 pphr) as the adhesion promoter and Megaface F-556 (0.3 pphr) as a nonionic surfactant were mixed in an appropriately sized amber HDPE bottle. The mixture was rolled for 18 hours to produce a homogeneous solution. Particle contamination was removed by filtering the polymer solution through a 0.2 µm pore polytetrafluoroethylene (PTFE) disc filter, the filtered polymer solution was collected in a low particle HDPE amber bottle and the resulting solution stored at 5° C.

Example 7

The procedures of Example 6 was substantially repeated in this Example 7 except that PBG-2 was used instead of PBG-1.

Example 8

A fully ring opened, ROMA, copolymer having the monomer composition of 50:50 molar ratio of PENB/MA ring opened with methanol ($M_w$ 8,600 and PDI 1.9, having substantially the repeat units of formula (IIA) where $R_7$ is methyl and $R_8$ is hydrogen) (100 parts resin) was dissolved in PGMEA (800 parts) having the specific amounts of additives, expressed as parts per hundred resin (pphr), PAG-1 (5 pphr) as a photo-acid generator, Base-1 (5 pphr) as a base additive, TMPTGE (40 pphr) as a crosslinking agent, KBM-403E (3 pphr) as the adhesion promoter and Megaface F-556 (0.3 pphr) as a nonionic surfactant were mixed in an appropriately sized amber HDPE bottle. The mixture was rolled for 18 hours to produce a homogeneous solution. Particle contamination was removed by filtering the polymer solution through a 0.2 µm pore polytetrafluoroethylene (PTFE) disc filter, the filtered polymer solution was collected in a low particle HDPE amber bottle and the resulting solution stored at 5° C.

Example 9

A fully ring opened, ROMA, copolymer having the monomer composition of 50:50 molar ratio of PENB/MA ring opened with methanol ($M_w$ 8,700 and PDI 2.0, having substantially the repeat units of formula (IIA) where $R_7$ is methyl and $R_8$ is hydrogen) (100 parts resin) was dissolved in GBL (150 parts) having the specific amounts of additives, expressed as parts per hundred resin (pphr), PAG-1 (4.7 pphr) as a photo-acid generator, Base-2 (2.5 pphr) as a base additive, TMPTGE (20 pphr) as a crosslinking agent, GE-36 (40 pphr) as a cross linking agent, SIT 7908.0 (3 pphr), Naugard 445 (5 pphr), AO-80 (5 pphr), Megaface F-556 (0.3 pphr) and GBL (100 pphr) were mixed in an appropriately sized amber HDPE bottle. The mixture was rolled for 18 hours to produce a homogeneous solution. Particle contamination was removed by filtering the polymer solution through a 1 µm pore polytetrafluoroethylene (PTFE) disc filter, the filtered polymer solution was collected in a low particle HDPE amber bottle and the resulting solution stored at 5° C.

Example 10

A fully ring opened, ROMA, copolymer having the monomer composition of 50:50 molar ratio of PENB/MA ring opened with methanol (Mw 8,700 and PDI 2.0, having substantially the repeat units of formula (IIA) where $R_7$ is methyl and $R_8$ is hydrogen) (100 parts resin) was dissolved in GBL (150 parts) having the specific amounts of additives, expressed as parts per hundred resin (pphr), PAG-1 (4 pphr) as a photo-acid generator, Base-1 (0.25 pphr) as a base additive, Base-3 (16 pphr) as a base additive, TMPTGE (20 pphr) as a crosslinking agent, GE-36 (40 pphr) as a cross linking agent, SIT 7908.0 (3 pphr), Naugard 445 (5 pphr), AO-80 (5 pphr) and Megaface F-556 (0.3 pphr) were mixed in an appropriately sized amber HDPE bottle. The mixture was rolled for 18 hours to produce a homogeneous solution. Particle contamination was removed by filtering the polymer solution through a 1 m pore polytetrafluoroethylene (PTFE) disc filter, the filtered polymer solution was collected in a low particle HDPE amber bottle and the resulting solution stored at 5° C.

Examples 11-16

Dissolution Rate (DR) and FT-IR Measurements

The following Examples illustrate the dissolution rate (DR) measurements of the compositions of Examples 1-10. The compositions of Examples 1 and 2 were spin coated on a 4-inch thermal oxide silicon wafer at 500 rpm for 30 seconds and post apply baked (PAB) at 110° C. for 3 minutes to form a film of the respective composition from each of Examples 1-10. The wafers were cleaved into two parts. One part of the film was first exposed to a blanket exposure dose of 1 J/cm$^2$ (EXD) and post exposure baked (PEB) at 130° C. for 5 minutes. The other part was baked at 130° C. for 5 minutes to mimic the PEB without the blanket exposure. The film thicknesses of these films were measured and found to range from 2-4 µm. These were immersed in 2.38 wt. % TMAH and the film thicknesses (FT) were measured again after 5-40 second time intervals. The dissolution rates (DR) in 2.38 wt. % TMAH as nm/sec were estimated as the slope of the film thickness vs. time plots. Similarly a solution of the polymer in GBL used in Example 1 was spin coated on a 4-inch thermal oxide silicon wafer at 500 rpm for 30 seconds and post apply baked (PAB) at 110° C. for 3 minutes followed by a second bake at 130° C./5 minutes to mimic the PEB. The dissolution rate of this film having film thickness of 2.03 µm was estimated as 63 nm/sec using the same procedure as described above.

FT-IR Measurements

Films of composition Examples 1 and 2 were prepared using the same method as described above for DR measurements except no TMAH immersion was conducted for IR measurements (Examples 13 to 16). Also included in this study was a solution of the polymer alone (Examples 11 and 12). Small amounts of the films were scraped out and their FT-IR spectra were taken on a diamond cell. FT-IR peaks observed at about 1853 $cm^{-1}$ and 1774 $cm^{-1}$ are characteristic of cyclic anhydrides (structure IIB) and a peak at about 1735 $cm^{-1}$ is characteristic for carbonyl group of carboxylic acid and a carboxylic acid ester (structure IIA where $R_7$ is methyl and $R_8$ is hydrogen). The peak heights representing the cyclic anhydride at about 1774 $cm^{-1}$ and the carboxylic acid and its methyl ester were measured from an arbitrary baseline drawn consistently for all spectra. The relative amounts of the cyclic anhydride present in the film were compared from the ratio of those peak heights.

The FT-IR peak ratios as a comparison for the relative presence of cyclic anhydride and the dissolution rates of these films are summarized in Table 1. It is evident from the data presented in Examples 11 and 12 of Table 1 for the polymer solution that the incorporation of a second bake step to mimic the PEB causes partial ring closure of acid-ester group of the polymer to generate cyclic anhydride form (structure IIB) associated with some decrease in its dissolution rate. This effect is more pronounced in the unexposed film using the composition of Example 1 as evident in Example 13. That is, even with no exposure to light, the PEB causes more cyclization of the ring opened repeat units of formula (IIA) to anhydride form, i.e., repeat units of formula (IIB). However this effect is less prominent in the exposed areas as evident in Example 14, i.e., the composition of Example 1 when exposed to an actinic light at a dosage of 1 $J/cm^2$ lowers the extent of ring closure to form the repeat units of formula (IIB) because of the fact that the exposure causes PAG to form a free acid which is neutralized by the base, and therefore, there is not enough base present in the composition to affect the ring closure to anhydride form. As a result, this facilitates a dissolution rate (DR) contrast in exposed and unexposed regions of the film where the exposed area has a higher DR than the unexposed area enabling positive tone imaging of these formulated films having good resolution of images. This DR contrast is more prominent in Examples 15 and 16 where in addition to a PAG and base additives a tri-functional epoxy cross-linker is also present in the composition (i.e., composition of Example 2).

TABLE 1

| Example | Composition Example | EXD (1 $J/cm^{-2}$) | PEB | Peak Ratio (1774 $cm^{-1}$/ 1735 $cm^{-1}$) | DR (nm/sec) |
|---|---|---|---|---|---|
| 11 | Only PENB/MA, ROMA polymer | No | No | 0.57 | 84 |
| 12 | Only PENB/MA, ROMA polymer | No | Yes | 0.70 | 63 |
| 13 | 1 | No | Yes | 0.87 | 19 |
| 14 | 1 | Yes | Yes | 0.64 | 56 |
| 15 | 2 | No | Yes | 0.93 | 0 (very low) |
| 16 | 2 | Yes | Yes | 0.76 | 24 |

FIG. 1 shows the FT-IR spectra of the films obtained from Examples 15 and 16. It is evident from FIG. 1 that the relative peak heights of 1774 $cm^{-1}$ (ring closed or the anhydride peak) and 1735 $cm^{-1}$ (peak due to carbonyl of the free acid, ester or the carboxylic acid crosslinked with epoxy) for film from Example 15 where the film was not exposed to radiation clearly shows more ring closure (i.e., more pronounced anhydride peak) than the film from Example 16 where the peak due to anhydride is smaller.

As illustrated in Scheme 1 discussed hereinabove, the base additive in the exposed regions is neutralized by the acid formed in those regions of the film by photo conversion of the PAG. Therefore no significant change is occurring in the exposed regions during the PEB step. However, the presence of the base additive in the unexposed regions in the absence of any acid to neutralize it will cause the ring closure of repeat units of formulae (IIA) to (IIB) as evidenced by the FT-IR spectroscopic studies as discussed above, and thereby limiting the aqueous base solubility in the exposed regions. Furthermore when an epoxy cross-linker is also present in the composition the base additive may catalyze the cross-linking of the polymer in the unexposed regions. This may cause further lowering of the aqueous base developability of the unexposed regions. Thus resulting in a high resolution positive tone images, which are further illustrated by the following examples.

Photo Imaging Examples

Examples 17-24

The following Examples illustrate the photo imaging capability of the compositions of Examples 1-8. The compositions of Examples 1-8 were spin coated at a spin speed of 800 rpm for 30 seconds for compositions of Examples 1-5 and 4500 rpm for compositions of Examples 6-8 on a 4-inch thermal oxide silicon wafer. The coated films were post apply baked (PAB) at 110° C. for compositions of Examples 1-5 and 100° C. for compositions of Examples 6-8 on a hot plate for 3 minutes in each of the Examples. The films were then exposed using a combination of a patterned mask and a variable density mask to a broad band Hg-vapor light source (at 365 nm using a band pass filter) at an exposure dose of 1000 $mJ/cm^2$. The exposed films were post exposure baked (PEB), developed for a given time (Dev.) with 2.38 wt. % TMAH in a puddle, rinsed with distilled water and dried using a stream of nitrogen. The film thicknesses (FT) were measured after PAB and development. The unexposed film thickness loss or dark field loss (DFL) was determined from the percent FT loss of an unexposed region of the film after development. In some cases there is a gain of the film thickness in the unexposed regions. This is due to the swelling of the film and is denoted as positive value and the typical loss of the film is denoted as a negative value. The formation of images (trenches, pillars and contact holes) were observed by an optical microscope to determine the resolution capability for trenches, pillars and contact holes (CH) from their top-down images.

These imaged films were cured in an oven under nitrogen atmosphere at 200° C. for 1 hour to determine their thermal flow. The thermal flow was deemed good for Examples 17-24 based on the observation that the features remained intact after cure as observed by an optical microscope.

Table 2 summarizes the observed properties for the photo imaging results of the films generated from compositions of Examples 1-8.

TABLE 2

| Example | Composition Example | FT (μm) | Dose (mJ/cm$^2$) | PEB (° C./min) | Dev. (sec) | DFL (%) | Resolution (μm) Trench/pillar/CH |
|---|---|---|---|---|---|---|---|
| 17 | 1 | 1.74 | 510 | 130/5 | 30 | −74 | 3/5/3 |
| 18 | 2 | 2.15 | 510 | 135/3 | 150 | −3 | 7/7/3 |
| 19 | 3 | 2.36 | 405 | 125/3 | 45 | −2 | 7/7/3 |
| 20 | 4 | 2.53 | 510 | 135/3 | 385 | +9 | 10/10/5 |
| 21 | 5 | 2.27 | 327 | 135/3 | 95 | −3 | 10/10/5 |
| 22 | 6 | 1.00 | 255 | 140/3 | 45 | −6 | 7/15/10 |
| 23 | 7 | 1.06 | 405 | 110/2 | 30 | +4 | 3/5/5 |
| 24 | 8 | 0.90 | 327 | None | 36 | −32 | 3/7/5 |

Example 25

The composition of Example 9 was spin coated at a spin speed of 1000 rpm for 30 seconds on a 4-inch thermal oxide silicon wafer. The coated film was post apply baked (PAB) at 120° C. on a hot plate for 3 minutes to obtain a film having a thickness of 7.89 μm. The film was then exposed using a combination of a patterned mask and a variable density mask to a broad band Hg-vapor light source (at 365 nm using a band pass filter) at an exposure dose of 700 mJ/cm$^2$. The exposed film was post exposure baked (PEB) at 140° C. for 3 minutes on a hot plate. The film thickness after PEB was 7.59 μm. The film was developed for 30 seconds with 2.38 wt. % TMAH in a puddle, rinsed with distilled water and dried using a stream of nitrogen. The film thicknesses (FT) after development was 3.48 μm. The unexposed film thickness loss or dark field loss (DFL) of 54% was calculated based on film thicknesses before and after development. Trenches at a resolution of about 7 μm and contact holes at a resolution of about 25 μm were observed by an optical microscope.

Example 26

Figure 2A:
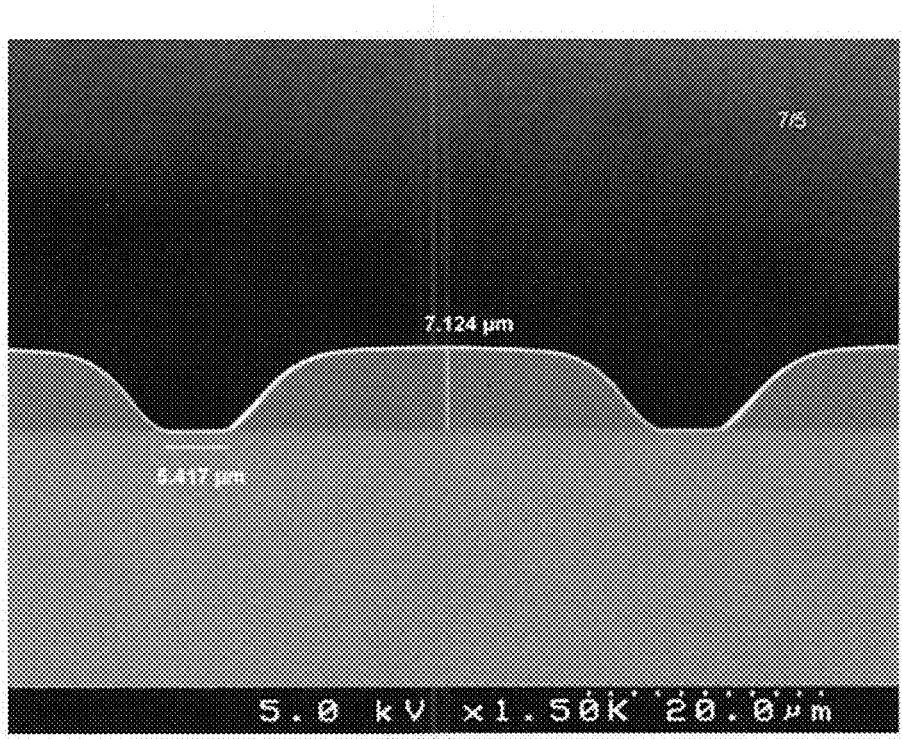
FIG. 2A and FIG. 2B show cross section scanning electron micrographs (SEM) of a positive tone lithographic images of 5 μm (FIG. 2A) and 10 μm isolated trenches (FIG. 2B) at an exposure dose of 255 mJ/cm$^2$ of one of the photosensitive composition embodiments of this invention.
Figure 2B:
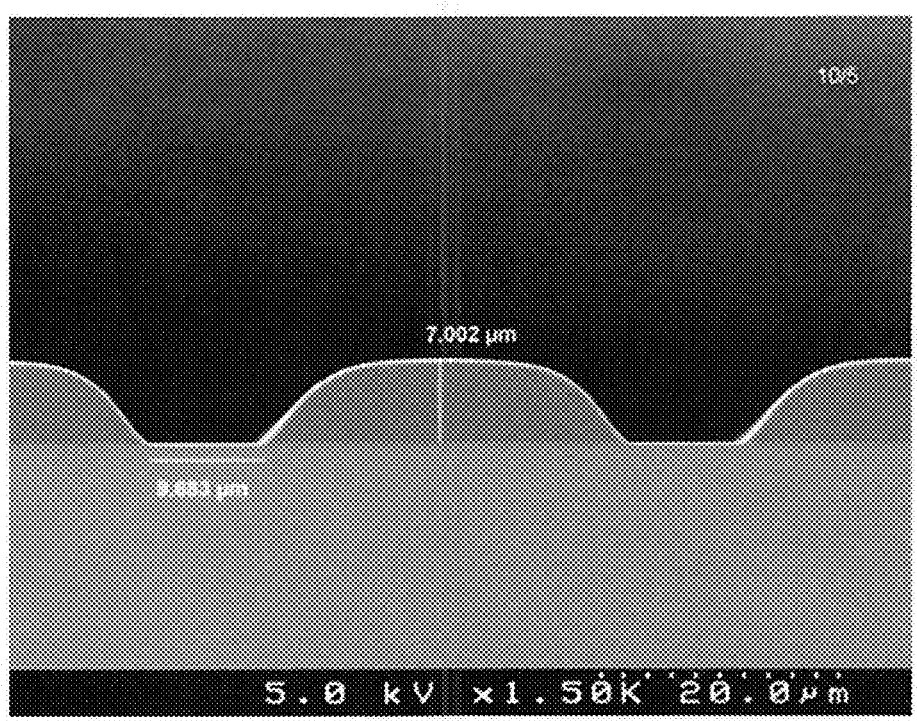

The composition of Example 10 was spin coated at a spin speed of 2000 rpm for 30 seconds on a 4-inch thermal oxide silicon wafer. The coated film was post apply baked (PAB) at 120° C. on a hot plate for 3 minutes to obtain a film having a thickness of 9.55 μm. The film was then exposed using a combination of a patterned mask and a variable density mask to a broad band Hg-vapor light source (at 365 nm using a band pass filter) at an exposure dose of 500 mJ/cm$^2$. The exposed film was post exposure baked (PEB) at 140° C. for 5 minutes on a hot plate. The film thickness after PEB was 9.08 μm. The film was developed for 115 seconds with 2.38 wt. % TMAH in a puddle, rinsed with distilled water and dried using a stream of nitrogen. The film thicknesses (FT) after development was 7.55 μm. The unexposed film thickness loss or dark field loss (DFL) of 17% was calculated based on film thicknesses before and after development. FIGS. 2A and 2B show the scanning electron microscopy (SEM) micrographs of a cross section of 5 and 10 μm trenches respectively at the exposure dose of 255 mJ/cm$^2$.

Example 27

Figure 3:
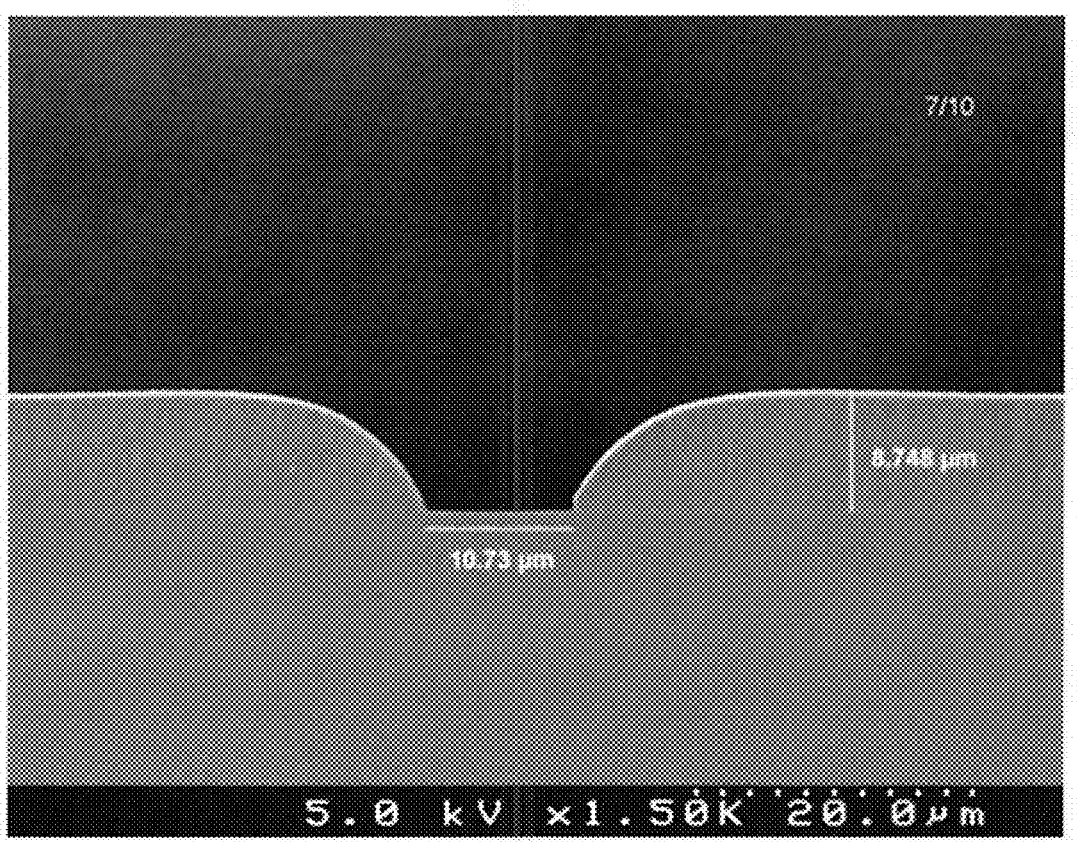
FIG. 3 shows cross section scanning electron micrograph (SEM) of a positive tone lithographic images of 10 µm isolated trenches at an exposure dose of 283 mJ/cm² of one of the photosensitive composition embodiments of this invention.

The composition of Example 10 was spin coated at a spin speed of 1500 rpm for 30 seconds on a 4-inch thermal oxide silicon wafer. The coated film was post apply baked (PAB) at 120° C. on a hot plate for 3 minutes to obtain a film thickness of 13.77 μm. The film was then exposed using a combination of a patterned mask and a variable density mask to a broad band Hg-vapor light source (at 365 nm using a band pass filter) at an exposure dose of 700 mJ/cm$^2$. The exposed film was post exposure baked (PEB) at 140° C. for 5 minutes on a hot plate. The film thickness after PEB was 13.28 μm. The film was developed for 155 seconds with 2.38 wt. % TMAH in a puddle, rinsed with distilled water and dried using a stream of nitrogen. The film thicknesses (FT) after development was 10.67 μm. The unexposed film thickness loss or dark field loss (DFL) of 20% was calculated based on film thicknesses before and after development. The film was cured at 180° C. for 2 hours in an oven under nitrogen atmosphere. FIG. 3 shows the SEM micrograph of a cross section of 10 μm trench after the cure step at the exposure dose of 283 mJ/cm$^2$.

Example 28

Figure 4A:
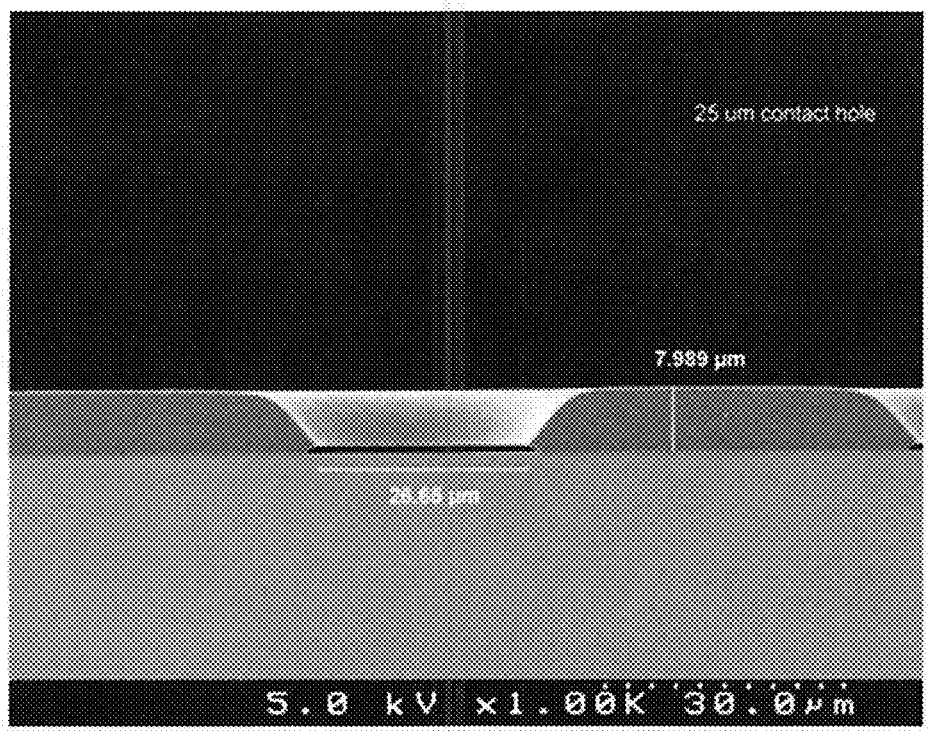
FIG. 4A and FIG. 4B show cross section scanning electron micrographs (SEM) of a positive tone lithographic images of 25 µm contact holes before cure (FIG. 4A) and after cure (FIG. 4B) of one of the photosensitive composition embodiments of this invention.
Figure 4B:
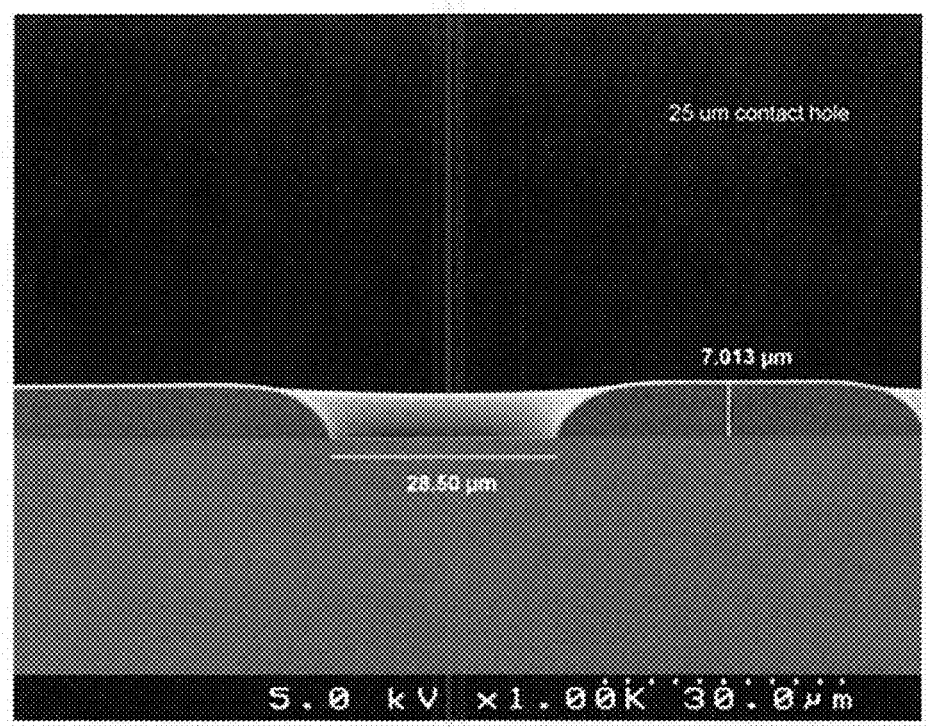

The composition of Example 10 was spin coated at a spin speed of 1100 rpm for 30 seconds on a 4-inch thermal oxide silicon wafer. The coated film was post apply baked (PAB) at 110° C. on a hot plate for 3 minutes to obtain a film thickness of 10.51 μm. The film was then exposed using a patterned mask to a broad band Hg-apor light source (at 365 nm using a band pass filter) at an exposure dose of 500 mJ/cm$^2$. The exposed film was post exposure baked (PEB) at 140° C. for 6 minutes on a hot plate. The film thickness after PEB was 10.12 μm. The film was developed for 95 seconds with 2.38 wt. % TMAH in a puddle, rinsed with distilled water and dried using a stream of nitrogen. The film thicknesses (FT) after development was 7.85 μm. The unexposed film thickness loss or dark field loss (DFL) of 22% was calculated based on film thicknesses before and after development. The film was cured at 180° C. for 2 hours in an oven under nitrogen atmosphere. FIG. 4A shows the SEM micrograph of a cross section of 25 μm contact holes (CH) before cure and FIG. 4B shows the SEM micrograph of a cross section of 25 μm contact holes (CH) after the cure step.

Examples 29-31

Thermomechanical Property Measurements

In three separate Examples 29-31, the composition of Example 10 was spin coated onto a 5-inch bare silicon wafers to obtain films in the thickness range from 9-12 μm. Each of these films were cured in an oven under nitrogen atmosphere at 180° C. for 2 hours. Then various thermomechanical properties of these films were measured as summarized in Table 3.

TABLE 3

Thermomechanical properties of formulation examples 10-12

| Measured Property | Example 29 | Example 30 | Example 31 |
|---|---|---|---|
| Wafer Stress (MPa) | 8 ± 3 | 10 ± 1 | 10 ± 3 |
| $T_g$ (TMA), ° C. | 106 | 111 | 108 |
| ETB (%) | 4 | 3 | 8 |
| Tensile Strength (MPa) | 39 | 40 | 40 |
| Young's Modulus (GPa) | 1.8 | 2.1 | 1.8 |
| $T_{d5}/T_{d50}$, ° C. (TGA) | 293/380 | 293/392 | 295/465 |

ETB = elongation to break; $T_g$ = glass transition temperature; TMA = thermomechanical analysis; TGA = thermogravimetric analysis; $T_{d5}$ = temperature at which 5 weight percent loss of the material observed; $T_{d50}$ = temperature at which 50 weight percent loss of the material observed.

The following Comparative Examples 1-4 are provided to show in the absence of a PAG the composition thus formed cannot be photoimaged and in the absence of a base the composition so formed forms a negative tone photoimageable composition.

Comparative Example 1

A fully ring opened, ROMA, copolymer having the monomer composition of 50:50 molar ratio of PENB/MA ring opened with methanol ($M_w$ 8,700 and PDI 2, repeat units of formula (IIA) where $R_7$ is methyl and $R_8$ is hydrogen) (100 parts resin) was dissolved in GBL (150 parts) having the specific amounts of additives, expressed as parts per hundred resin (pphr), Base-1 (0.5 pphr) and Base-3 (15 pphr) as base additives, TMPTGE (30 pphr) as a crosslinking agent, KBM-403E (3 pphr) as the adhesion promoter and GBL (300 pphr) were mixed in an appropriately sized amber HDPE bottle. The mixture was rolled for 18 hours to produce a homogeneous solution. Particle contamination was removed by filtering the polymer solution through a 1 μm pore polytetrafluoroethylene (PTFE) disc filter, the filtered polymer solution was collected in a low particle HDPE amber bottle and the resulting solution stored at 5° C.

Comparative Example 2

A fully ring opened, ROMA, copolymer having the monomer composition of 50:50 molar ratio of PENB/MA ring opened with methanol ($M_w$ 8,700 and PDI 2, repeat units of formula (IIA) where $R_7$ is methyl and $R_8$ is hydrogen) (100 parts resin) was dissolved in GBL (150 parts) having the specific amounts of additives, expressed as parts per hundred resin (pphr), PAG-2 (2 pphr) as a photo-acid generator, TMPTGE (30 pphr) as a crosslinking agent, KBM-403E (3 pphr) as the adhesion promoter and GBL (300 pphr) were mixed in an appropriately sized amber HDPE bottle. The mixture was rolled for 18 hours to produce a homogeneous solution. Particle contamination was removed by filtering the polymer solution through a 1 μm pore polytetrafluoroethylene (PTFE) disc filter, the filtered polymer solution was collected in a low particle HDPE amber bottle and the resulting solution stored at 5° C.

Comparative Example 3

The composition of Comparative Example 1 was spin coated at a spin speed of 800 rpm for 30 seconds on a 4-inch thermal oxide silicon wafer. The coated film was post apply baked (PAB) at 110° C. for 3 minutes to obtain a film having film thickness of 2 μm. This film was exposed using a combination of a patterned mask and a variable density mask to a broad band Hg-vapor light source (at 365 nm using a band pass filter) at an exposure dose of 1000 mJ/cm². The exposed film was post exposure baked (PEB) at 135° C. for 5 minutes, developed for 150 seconds with 2.38 wt. % TMAH in a puddle, rinsed with distilled water and dried using a stream of nitrogen. The film thickness (FT) after the development was 1.87 μm in unexposed regions of the film. The unexposed film thickness loss or dark field loss (DFL) of 7% was determined from the percent FT loss of an unexposed region of the film after development. There was no formation of images observed by an optical microscope in this instance demonstrating that the mere presence of base additives is not sufficient to affect positive tone photo imaging.

Comparative Example 4

The composition of Comparative Example 2 was spin coated at a spin speed of 800 rpm for 30 seconds on a 4-inch thermal oxide silicon wafer. The coated film was post apply baked (PAB) at 110° C. for 3 minutes to obtain a film having film thickness of 1.45 μm. This film was exposed using a combination of a patterned mask and a variable density mask to a broad band Hg-vapor light source (at 365 nm using a band pass filter) at an exposure dose of 1000 mJ/cm². The exposed films were post exposure baked (PEB) at 135° C. for 1 minute, developed for 30 seconds with 2.38 wt. % TMAH in a puddle, rinsed with distilled water and dried using a stream of nitrogen. The film thickness (FT) after the development was zero in unexposed regions of the film showing that the entire film has dissolved in 2.38 wt. % TMAH. The unexposed film thickness loss or dark field loss (DFL) of 100% can be calculated from the percent FT loss of an unexposed region of the film after development. There was formation of negative tone images observed by an optical microscope in this instance demonstrating that the presence of a photo acid generator is capable of affecting negative tone photo imaging in the absence of a base additives. The film thickness of a region exposed to 510 mJ/cm² exposure dose was 1.64 μm. The exposed film thickness loss or bright field loss (BFL) can be calculated from the percent FT change of the exposed region of the film after development. In this instance a film thickness gain of 12% in the region exposed to 510 mJ/cm² exposure dose was observed.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:
1. A composition comprising:
 a polymer comprising one or more distinct first repeating unit represented by formula (IA), each of said first repeating unit is derived from a monomer of formula (I):

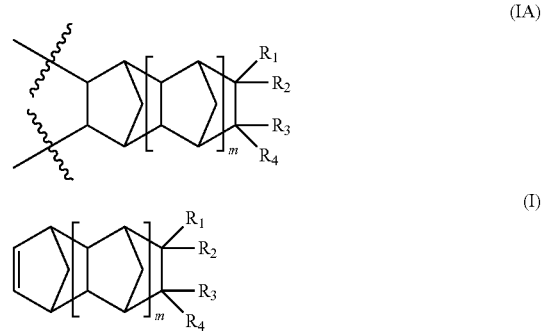

wherein:
  ᴧᴧᴧ represents a position at which the bonding takes place with another repeat unit;
  m is an integer 0, 1 or 2;
  $R_1$, $R_2$, $R_3$ and $R_4$ independently represents hydrogen, linear or branched ($C_1$-$C_{16}$)alkyl, hydroxy($C_1$-$C_{12}$) alkyl, perfluoro($C_1$-$C_{12}$)alkyl, ($C_3$-$C_{12}$)cycloalkyl, ($C_6$-$C_{12}$)bicycloalkyl, ($C_7$-$C_{14}$)tricycloalkyl, ($C_6$-$C_{10}$)aryl, ($C_6$-$C_{10}$)aryl($C_1$-$C_3$)alkyl, perfluoro($C_6$-$C_{10}$)aryl, perfluoro($C_6$-$C_{10}$)aryl($C_1$-$C_3$)alkyl, ($C_5$-$C_{10}$)heteroaryl, ($C_5$-$C_{10}$)heteroaryl($C_1$-$C_3$)alkyl, hydroxy, ($C_1$-$C_{12}$) alkoxy, ($C_3$-$C_{12}$)cycloalkoxy, ($C_6$-$C_{12}$)bicycloalkoxy, ($C_7$-$C_{14}$)tricycloalkoxy, —$(CH_2)_a$—(O—$(CH_2)_b)_c$—O—($C_1$-$C_4$)alkyl, where a, b and c are integers from 1 to 4, ($C_6$-$C_{10}$)aryloxy($C_1$-$C_3$)alkyl, ($C_5$-$C_{10}$)heteroaryloxy($C_1$-$C_3$)alkyl, ($C_6$-$C_{10}$)aryloxy, ($C_5$-$C_{10}$)heteroaryloxy, ($C_1$-$C_6$)acyloxy and halogen; and a second repeating unit represented by formula (IIA), said second repeating unit is derived from a monomer of formula (II):

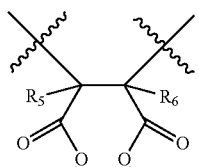

(IIA)

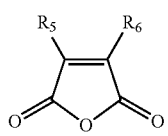

(II)

wherein:
$R_5$ and $R_6$ independently of each other selected from hydrogen and methyl;
$R_7$ is selected from the group consisting of methyl, ethyl, n-propyl and n-butyl;
$R_8$ is hydrogen;
a photoacid generator, which forms an acid when exposed to an actinic radiation;
a photobase generator, which forms a base when exposed to an actinic radiation; and
a carrier solvent; and wherein the base formed is present in a sufficient amount to neutralize the acid formed when the composition is exposed to an actinic radiation.

2. The composition according to claim 1, wherein said polymer further comprises a second distinct repeat unit of formula (IIB) derived from a monomer of formula (II):

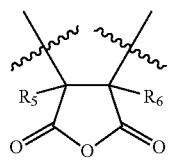

(IIB)

wherein $R_5$ and $R_6$ are as defined in claim 1.

3. The composition according to claim 1, wherein said polymer comprises one or more distinct repeating units of formula (IA) having:
m is 0;
$R_1$, $R_2$, $R_3$ and $R_4$ are independently selected from the group consisting of hydrogen, methyl, ethyl, linear or branched ($C_1$-$C_{12}$)alkyl, phenyl($C_1$-$C_3$)alkyl, —$(CH_2)_a$—(O—$(CH_2)_b)_c$—O—($C_1$-$C_4$)alkyl, where a is 1 or 2, b is 2 to 4 and c is 2 or 3.

4. The composition according to claim 1, wherein said polymer is having $R_5$ and $R_6$ each hydrogen; $R_7$ is selected from the group consisting of methyl and ethyl.

5. The composition according to claim 1, wherein said polymer is having one or more first repeating unit derived from a monomer selected from the group consisting of:
5-hexylbicyclo[2.2.1]hept-2-ene;
5-octylbicyclo[2.2.1]hept-2-ene;
5-decylbicyclo[2.2.1]hept-2-ene;
5-((2-(2-methoxyethoxy)ethoxy)methyl)bicyclo[2.2.1]hept-2-ene;
1-(bicyclo[2.2.1]hept-5-en-2-yl)-2,5,8,11-tetraoxadodecane;
5-benzylbicyclo[2.2.1]hept-2-ene; and
5-phenethylbicyclo[2.2.1]hept-2-ene.

6. The composition according to claim 1, wherein said polymer is having a second repeating unit derived from a monomer selected from the group consisting of:
maleic anhydride;
2-methyl-maleic anhydride (3-methylfuran-2,5-dione); and
2,3-dimethyl-maleic anhydride (3,4-dimethylfuran-2,5-dione).

7. The composition according to claim 1, wherein said polymer is selected from the group consisting of:
a copolymer of 5-phenethylbicyclo[2.2.1]hept-2-ene (PENB) and maleic anhydride in which maleic anhydride repeating unit is ring opened with methanol (50:50 molar ratio);
a copolymer of 5-phenethylbicyclo[2.2.1]hept-2-ene (PENB) and maleic anhydride in which maleic anhydride repeating unit is ring opened with ethanol (50:50 molar ratio); and
a copolymer of 5-phenethylbicyclo[2.2.1]hept-2-ene (PENB) and maleic anhydride in which maleic anhydride repeating unit is ring opened with n-butanol (50:50 molar ratio).

8. The composition according to claim 1, wherein said photoacid generator is selected from the group consisting of:
(p-isopropylphenyl)(p-methylphenyl)-iodonium tetrakis(pentafluorophenyl) borate;
(2-(4-methoxynaphthalen-1-yl)-2-oxoethyl)dimethylsulfonium tetrakis(perfluorophenyl)borate;
bis(4-((4-acetylphenyl)thio)phenyl)(4-(phenylthio)cyclohexyl)sulfonium tris((trifluoromethyl)sulfonyl)methanide;
1,3-dioxo-1H-benzo[de]isoquinolin-2(3H)-yl trifluoromethanesulfonate (NIT); and
1,3-dioxo-1H-benzo[de]isoquinolin-2(3H)-yl 1,1,2,2,3,3,4,4,4-nonafluorobutane-1-sulfonate.

9. The composition according to claim 1, wherein said photobase generator is selected from the group consisting of:
a compound of formula (VI):

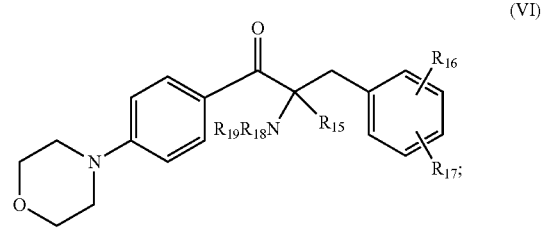

(VI)

a compound of formula (VII):

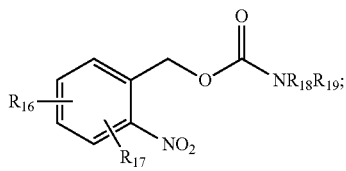
(VII)

a compound of formula (VIII):

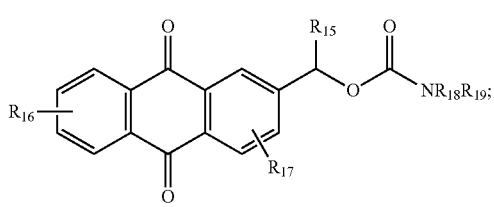
(VIII)

a compound of formula (IXA):

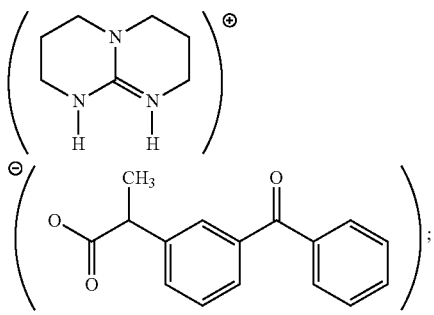
(IXA)

a compound of formula (IXB):

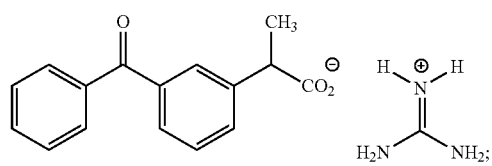
(IXB)

and
a compound of formula (IXC):

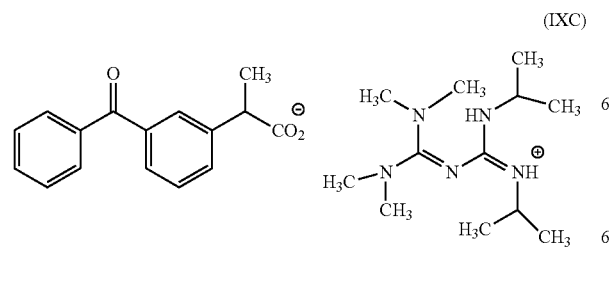
(IXC)

wherein
$R_{15}$, $R_{16}$ and $R_{17}$ are the same or different and each independently of one another is selected from the group consisting of hydrogen, linear or branched $(C_1-C_{16})$ alkyl, $(C_6-C_{10})$aryl, $(C_6-C_{10})$aryl$(C_1-C_3)$alkyl, hydroxy, halogen, linear or branched $(C_1-C_{12})$alkoxy and $(C_6-C_{10})$aryloxy; and $R_{18}$ and $R_{19}$ each independently of one another selected from the group consisting of hydrogen, linear or branched $(C_1-C_8)$alkyl and $(C_6-C_{10})$aryl; or $R_{18}$ and $R_{19}$ taken together with the nitrogen atom to which they are attached form a 5 to 7 membered monocyclic ring or 6 to 12 membered bicyclic ring, said rings optionally containing one or more additional heteroatoms selected from O and N, and said rings optionally substituted with linear or branched $(C_1-C_8)$ alkyl, $(C_6-C_{10})$aryl, halogen, hydroxy, linear or branched $(C_1-C_8)$alkoxy and $(C_6-C_{10})$aryloxy.

10. The composition according to claim 9, wherein said photobase generator is selected from the group consisting of:
a compound of formula (VI):

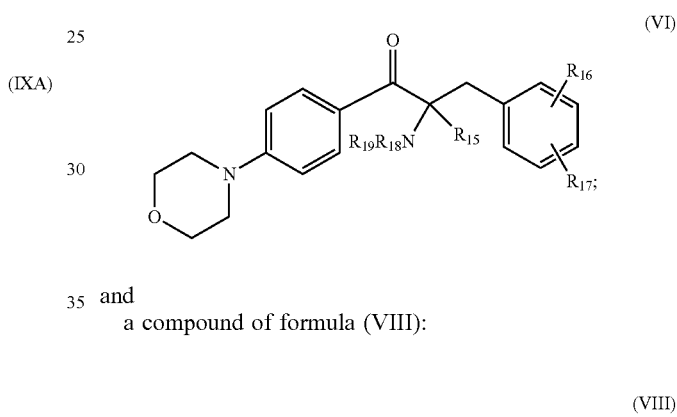
(VI)

and
a compound of formula (VIII):

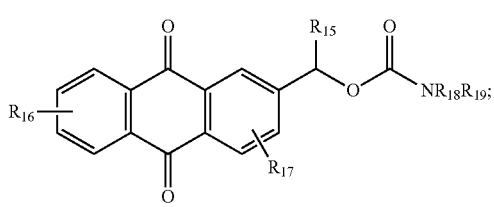
(VIII)

wherein,
$R_{15}$, $R_{16}$ and $R_{17}$ are the same or different and each independently of one another is selected from the group consisting of hydrogen, methyl, ethyl, n-propyl, iso-propyl, n-butyl and phenyl; and $R_{18}$ and $R_{19}$ each independently of one another selected from the group consisting of hydrogen, methyl, ethyl, n-propyl, iso-propyl and n-butyl; or $R_{18}$ and $R_{19}$ taken together with the nitrogen atom to which they are attached form a pyridine or pyrimidinyl ring.

11. The composition according to claim 1, wherein said photobase generator is selected from the group consisting of:
2-benzyl-2-(dimethylamino)-1-(4-morpholinophenyl)butan-1-one;
2-(dimethylamino)-2-(4-methylbenzyl)-1-(4-morpholinophenyl)butan-1-one;
1-(9,10-dioxo-9,10-dihydroanthracen-2-yl)ethyl cyclohexylcarbamate;

1-(9,10-dioxo-9,10-dihydroanthracen-2-yl)ethyl 1H-imidazole-1-carboxylate; and 1-(9,10-dioxo-9,10-dihydroanthracen-2-yl)ethyl pyrimidine-1(6H)-carboxylate.

12. The composition according to claim 1, which further comprises an epoxy resin selected from the group consisting of:

triglycidyl ether of poly(oxypropylene)epoxide ether of glycerol;
trimethylolpropane triglycidylether;
bisphenol A epichlorohydrin based epoxy resin;
polypropylene glycol epichlorohydrin based epoxy resin;
bis(4-(oxiran-2-ylmethoxy)phenyl)methane;
glycidyl ether of para-tertiary butyl phenol;
polyethylene glycol diglycidyl ether; and
polypropylene glycol diglycidyl ether;
and a mixture in any combination thereof.

13. The composition according to claim 1, wherein said solvent is selected from the group consisting of propyleneglycol monomethylether acetate (PGMEA), gamma-butyrolactone (GBL) and N-methylpyrrolidone (NMP) and a mixture in any combination thereof.

14. The composition according to claim 1, wherein said composition further comprises one or more additives selected from the group consisting of:

adhesion promoters;
antioxidants;
surfactants;
thermal acid or thermal base generator; and
mixtures in any combination thereof.

15. A process for forming a cured product, comprising: (i) applying the composition of claim 1 on a substrate to form a coating film, (ii) exposing the coating film to light through a desired pattern mask, (iii) dissolving and removing the exposed portions by developing with an alkaline developer to obtain the desired pattern, and (iv) heating the obtained desired pattern.

16. A cured product obtained by curing the composition of claim 1.

17. An optoelectronic or microelectronic device comprising the cured product of claim 16, which is having a dielectric constant of 3.2 or less at 1 MHz.

* * * * *